(12) United States Patent
Kim et al.

(10) Patent No.: US 10,468,414 B2
(45) Date of Patent: Nov. 5, 2019

(54) SEMICONDUCTOR MEMORY DEVICES

(71) Applicant: Samsung Electronics Co., Ltd., Suwon-si, Gyeonggi-do (KR)

(72) Inventors: Hui-Jung Kim, Seongnam-si (KR); Kiseok Lee, Hwaseong-si (KR); Junsoo Kim, Seongnam-si (KR); Sunghee Han, Hwaseong-si (KR); Bong-Soo Kim, Yongin-si (KR); Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/115,693

(22) Filed: Aug. 29, 2018

(65) Prior Publication Data

US 2019/0206869 A1    Jul. 4, 2019

Related U.S. Application Data

(60) Provisional application No. 62/611,193, filed on Dec. 28, 2017.

(30) Foreign Application Priority Data

Feb. 21, 2018    (KR) ........................ 10-2018-0020585

(51) Int. Cl.
| | | |
|---|---|---|
| H01L 27/11578 | (2017.01) | |
| H01L 27/108 | (2006.01) | |
| H01L 29/10 | (2006.01) | |
| H01L 29/78 | (2006.01) | |
| H01L 29/08 | (2006.01) | |

(Continued)

(52) U.S. Cl.
CPC ...... *H01L 27/10802* (2013.01); *H01L 23/528* (2013.01); *H01L 27/11578* (2013.01); *H01L 29/0847* (2013.01); *H01L 29/1033* (2013.01); *H01L 29/45* (2013.01); *H01L 29/7841* (2013.01); *H01L 29/792* (2013.01)

(58) Field of Classification Search
CPC .......................... H01L 27/11514; H01L 29/68
See application file for complete search history.

(56) References Cited

U.S. PATENT DOCUMENTS

| | | |
|---|---|---|
| 7,795,651 B2 | 9/2010 | Jeong et al. |
| 8,053,822 B2 | 11/2011 | Kim et al. |

(Continued)

FOREIGN PATENT DOCUMENTS

| | | |
|---|---|---|
| JP | 2013-165220 | 8/2013 |
| KR | 10-2010-0070835 | 6/2010 |

(Continued)

*Primary Examiner* — Cheung Lee
(74) *Attorney, Agent, or Firm* — Myers Bigel, P.A.

(57) ABSTRACT

Semiconductor memory devices are provided. A semiconductor memory device includes a substrate and a stack including a plurality of layers on the substrate. Each of the plurality of layers includes semiconductor patterns and a first conductive line that is connected to at least one of the semiconductor patterns. A second conductive line and a third conductive line penetrate the stack. The semiconductor patterns include a first semiconductor pattern and a second semiconductor pattern that are adjacent and spaced apart from each other in a first layer among the plurality of layers. The third conductive line is between, and connected in common to, the first and second semiconductor patterns.

20 Claims, 35 Drawing Sheets

(51) Int. Cl.
    *H01L 29/45*         (2006.01)
    *H01L 23/528*      (2006.01)
    *H01L 29/792*      (2006.01)

(56) References Cited

U.S. PATENT DOCUMENTS

| | | |
|---|---|---|
| 8,288,795 B2 | 10/2012 | Tang |
| 9,711,407 B2 | 7/2017 | Or-Bach et al. |
| 9,754,667 B2 | 9/2017 | Alsmeier |
| 9,799,761 B2 | 10/2017 | Or-Bach et al. |
| 9,953,965 B2 | 4/2018 | Park et al. |
| 2014/0054538 A1 | 2/2014 | Park |
| 2015/0008499 A1* | 1/2015 | Lee .................. H01L 27/11273 257/314 |
| 2015/0263173 A1 | 9/2015 | Lue |
| 2016/0071591 A1 | 3/2016 | Hsu |
| 2017/0053906 A1 | 2/2017 | Or-Bach et al. |
| 2017/0092371 A1 | 3/2017 | Harari |
| 2017/0103999 A1* | 4/2017 | Lee ..................... H05K 999/99 |

FOREIGN PATENT DOCUMENTS

| | | |
|---|---|---|
| KR | 10-1090979 B1 | 12/2011 |
| KR | 10-2013-0042302 A | 4/2013 |
| KR | 10-1420708 | 7/2014 |

\* cited by examiner

SEMICONDUCTOR MEMORY DEVICES

CROSS-REFERENCE TO RELATED APPLICATIONS

This U.S. non-provisional patent application claims priority to and the benefit of U.S. Provisional Patent Application No. 62/611,193, filed on Dec. 28, 2017, and Korean Patent Application No. 10-2018-0020585, filed on Feb. 21, 2018, the entire contents of which are hereby incorporated herein by reference.

BACKGROUND

The present disclosure relates to semiconductor devices. Higher integration of semiconductor devices may be desirable to satisfy consumer demands for superior performance and inexpensive prices. In the case of semiconductor devices, since their integration may be an important factor in determining product prices, increased integration may be especially desirable. In the case of two-dimensional or planar semiconductor devices, since their integration is mainly determined by the area occupied by a unit memory cell, integration is greatly influenced by the level of a fine pattern forming technology. However, the extremely expensive process equipment used to increase pattern fineness may set a practical limitation on increasing integration for two-dimensional or planar semiconductor devices. To overcome such a limitation, three-dimensional semiconductor memory devices including three-dimensionally arranged memory cells have recently been proposed.

SUMMARY

Some embodiments of the inventive concepts provide a three-dimensional semiconductor memory device configured to have an increased integration density.

According to some embodiments of the inventive concepts, a semiconductor memory device may include a substrate. The semiconductor memory device may include a stack including a plurality of layers that are vertically stacked on the substrate. Each of the plurality of layers may include semiconductor patterns that extend in a first direction and a first conductive line that is connected to at least one of the semiconductor patterns and extends in a second direction crossing the first direction. The semiconductor memory device may include a second conductive line and a third conductive line that extend in a third direction, perpendicular to the first and second directions, to penetrate the stack. The semiconductor patterns may include a first semiconductor pattern and a second semiconductor pattern that are adjacent and spaced apart from each other in the first direction in a first layer among the plurality of layers, and a third semiconductor pattern, in a second layer among the plurality of layers, that is vertically overlapped by the first semiconductor pattern in the third direction. The semiconductor memory device may include a gate insulating layer. The gate insulating layer may be between the second conductive line and the first and third semiconductor patterns. The third conductive line may be between, and connected in common to, the first and second semiconductor patterns.

According to some embodiments of the inventive concepts, a semiconductor memory device may include a substrate. The semiconductor memory device may include a stack including a plurality of layers that are vertically stacked on the substrate. Each of the plurality of layers may include first and second semiconductor structures that are adjacent and spaced apart from each other in a first direction, and a first conductive line that extends in the first direction to connect to the first and second semiconductor structures. The semiconductor memory device may include second conductive lines that extend vertically in a second direction that is perpendicular to the first direction to penetrate the stack and are spaced apart from each other in the first direction. First and second ones of the second conductive lines may be adjacent the first and second semiconductor structures, respectively. The semiconductor memory device may include a first gate insulating layer between the first semiconductor structure and the first one of the second conductive lines. The semiconductor memory device may include a second gate insulating layer between the second semiconductor structure and the second one of the second conductive lines. The semiconductor memory device may include third conductive lines that extend vertically in the second direction and are spaced apart from each other in the first direction. First and second ones of the third conductive lines may be connected to respective first ends of the first and second semiconductor structures. The semiconductor memory device may include a shield line that extends vertically in the second direction to penetrate the stack between the first and second ones of the second conductive lines.

According to some embodiments of the inventive concepts, a semiconductor memory device may include a substrate. The semiconductor memory device may include a stack including a plurality of layers that are vertically stacked on the substrate. Each of the plurality of layers may include a first insulating layer, a semiconductor layer, and a second insulating layer that are sequentially stacked. The semiconductor memory device may include a first conductive line that is in the second insulating layer and extends in a first direction. The semiconductor memory device may include a second conductive line and a third conductive line that extend vertically to penetrate the stack. The semiconductor memory device may include a gate insulating layer adjacent the second conductive line. The semiconductor layer may include a semiconductor pattern that is overlapped by the first conductive line and extends in a second direction crossing the first direction. The gate insulating layer may be between the second conductive line and the semiconductor pattern. The third conductive line may be connected to a first end of the semiconductor pattern.

According to some embodiments of the inventive concepts, a semiconductor memory device may include a substrate. The semiconductor memory device may include a first sub-cell array and a second sub-cell array on the substrate and spaced apart from each other in a first direction. The semiconductor memory device may include common conductive lines that vertically extend between the first and second sub-cell arrays. The common conductive lines may be spaced apart from each other in a second direction crossing the first direction. Each of the first and second sub-cell arrays may include first conductive lines that extend in the second direction and are vertically stacked, second conductive lines that extend vertically and are spaced apart from each other in the second direction, and memory cells between the first conductive lines and the second conductive lines. The memory cells may include a first memory cell and a second memory cell in the first sub-cell array and the second sub-cell array, respectively. The first memory cell and the second memory cell may be spaced apart from each other in the first direction. One of the common conductive lines may be between, and connected in common to, the first and second memory cells.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
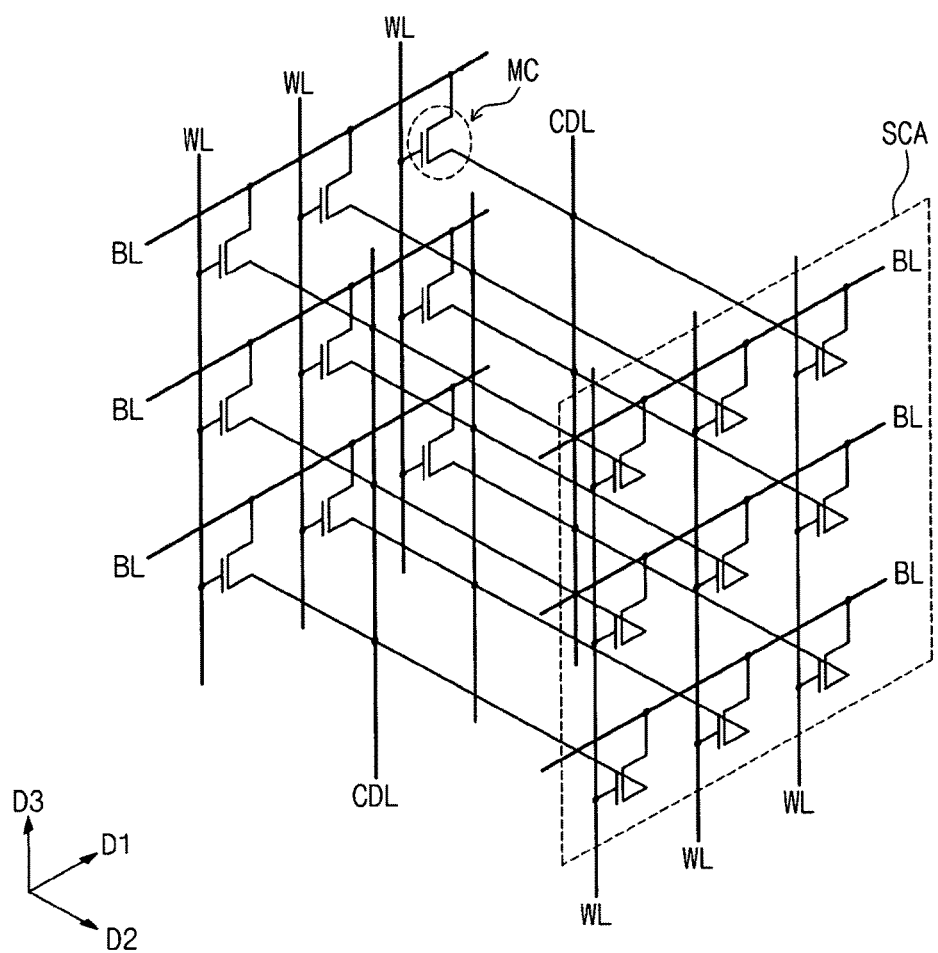
FIG. 1 is a circuit diagram schematically illustrating a cell array of a three-dimensional semiconductor memory device according to some embodiments of the inventive concepts.

FIG. 1 is a circuit diagram schematically illustrating a cell array of a three-dimensional semiconductor memory device according to some embodiments of the inventive concepts.

Referring to FIG. 1, a cell array of a three-dimensional semiconductor memory device according to some embodiments of the inventive concepts may include a plurality of sub-cell arrays SCA. The sub-cell arrays SCA may be arranged in a second direction D2.

Each of the sub-cell arrays SCA may include a plurality of bit lines BL, a plurality of word lines WL, and a plurality of memory cells MC. In some embodiments, each memory cell MC may be provided between a corresponding one of the word lines WL and a corresponding one of the bit lines BL.

Each of the memory cells MC may be a data storing element that is composed of one transistor. In some embodiments, each of the memory cells MC may have a capacitor-free structure. For example, the memory device according to the present embodiment may be a one-transistor dynamic random access memory (1T DRAM), from which a capacitor is omitted.

The bit lines BL may be conductive patterns (e.g., metal lines), which are provided over a substrate or are vertically spaced apart from the substrate. The bit lines BL may extend in a first direction D1. In each sub-cell array SCA, the bit lines BL may be spaced apart from each other in a vertical direction (hereinafter, a third direction D3) perpendicular to a top surface of the substrate (and perpendicular to the first direction D1 and the second direction D2).

The word lines WL may be conductive patterns (e.g., metal lines) extending in the vertical or third direction D3. In each sub-cell array SCA, the word lines WL may be spaced apart from each other in the first direction D1.

Common drain lines CDL may be provided between each one among a pair of adjacent ones of the sub-cell arrays SCA that are adjacent to each other in the second direction D2. The common drain lines CDL may be conductive patterns (e.g., metal lines) extending in the vertical or third direction D3. The common drain lines CDL may be spaced apart from each other in the first direction D1. For example, a plurality of the common drain lines CDL may be spaced apart from each other in the first direction D1 between adjacent first and second sub-cell arrays SCA that define a pair of the sub-cell arrays SCA.

Each of the common drain lines CDL may be connected in common to a pair of the memory cells MC, which are adjacent to each other in the second direction D2. For example, each of the common drain lines CDL may be connected in common to adjacent ones of a pair of the memory cells MC that are located at the same level.

Figure 2:
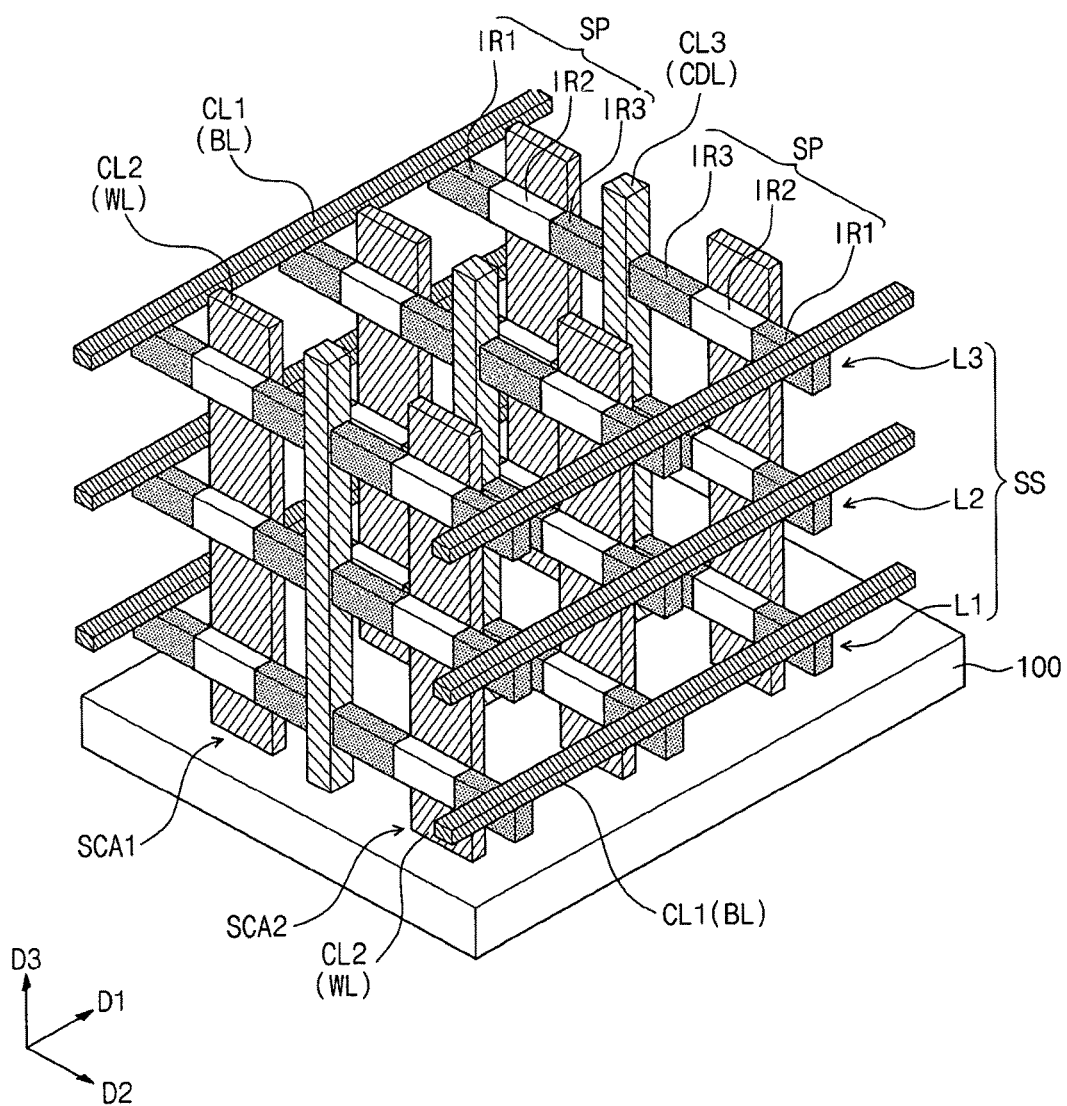
FIG. 2 is a perspective view illustrating a three-dimensional semiconductor memory device according to some embodiments of the inventive concepts.
Figure 3:
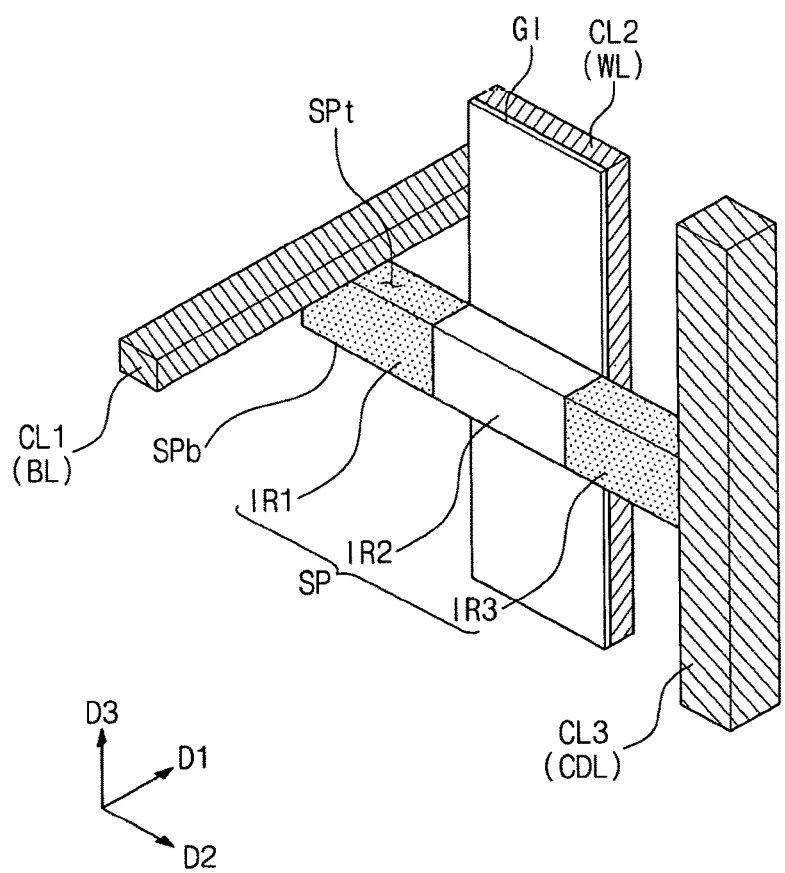
FIG. 3 is an enlarged perspective view illustrating a memory cell of the memory device of FIG. 2.
Figure 4:
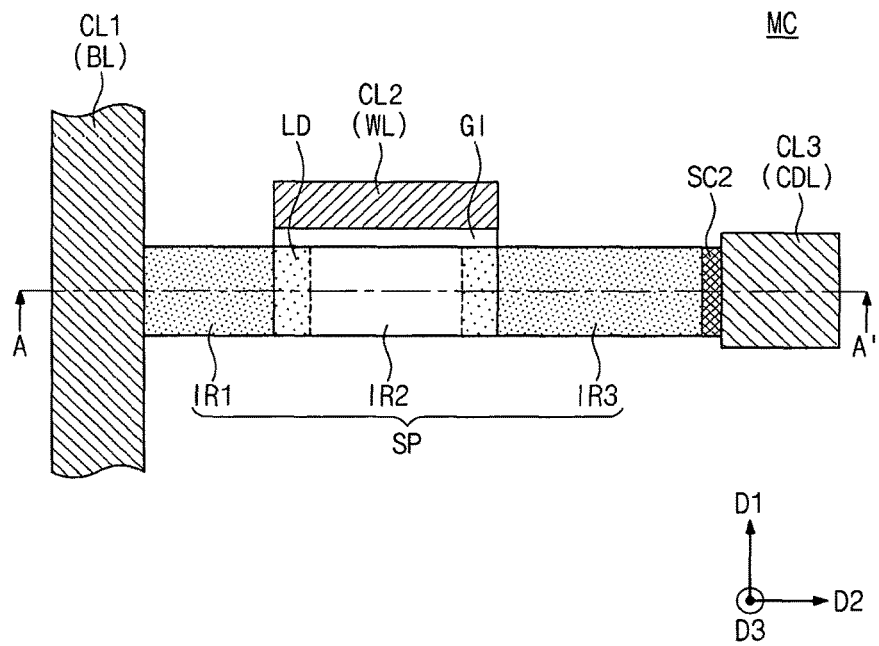
FIG. 4 is a plan view illustrating the memory cell of FIG. 3.
Figure 5:
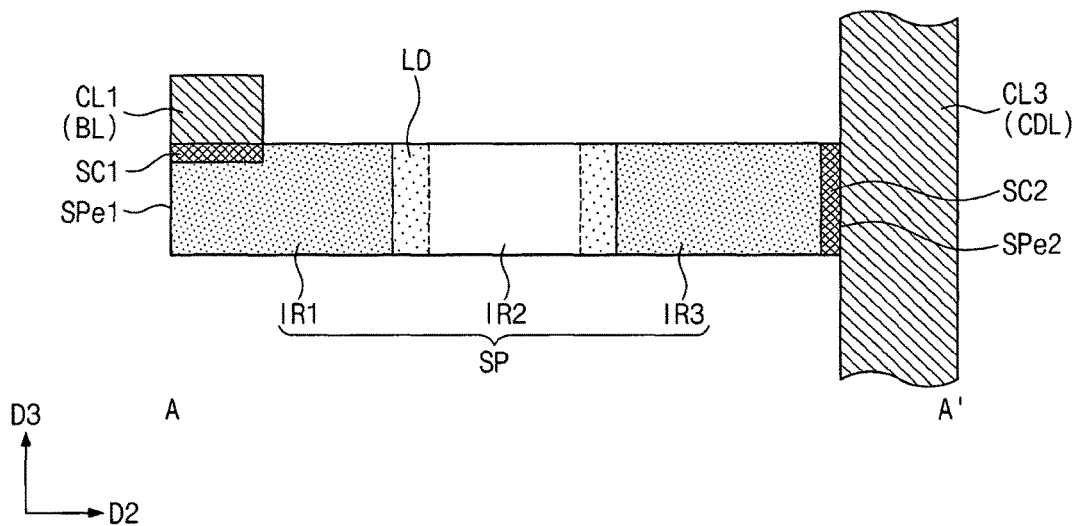
FIG. 5 is a sectional view taken along line A-A' of FIG. 4.

FIG. 2 is a perspective view illustrating a three-dimensional semiconductor memory device according to some embodiments of the inventive concepts. FIG. 3 is an enlarged perspective view illustrating a memory cell of the memory device of FIG. 2. FIG. 4 is a plan view illustrating the memory cell of FIG. 3. FIG. 5 is a sectional view taken along line A-A' of FIG. 4.

Referring to FIGS. 1 to 5, a first sub-cell array SCA1 and a second sub-cell array SCA2, which are two adjacent ones of the sub-cell arrays SCA described with reference to FIG. 1, may be provided on a substrate 100. The substrate 100 may be a silicon wafer, a germanium wafer, or a silicon-germanium wafer.

The pair of the first and second sub-cell arrays SCA1 and SCA2 may be provided in the form of a stack SS. The stack SS may include first to third layers L1, L2, and L3, which are vertically stacked on the substrate 100. The first to third layers L1, L2, and L3 may be sequentially stacked to be spaced apart from each other in the vertical or third direction D3. Each of the first to third layers L1, L2, and L3 may include a pair of first conductive lines CL1, which are spaced apart from each other in the second direction D2, and a plurality of semiconductor structures, such as semiconductor patterns SP, which are connected to each of the first conductive lines CL1.

Each of the semiconductor patterns SP may be a line-, bar-, or pillar-shaped pattern extending in the second direction D2. In some embodiments, the semiconductor patterns SP may be formed of or include at least one of silicon, germanium, silicon-germanium, or indium gallium zinc oxide (IGZO). Each of the semiconductor patterns SP may include a first impurity region IR1, a second impurity region IR2, and a third impurity region IR3. The second impurity region IR2 may be provided between the first and third impurity regions IR1 and IR3. The second impurity region IR2 may serve as a channel region of a transistor constituting the memory cell MC of FIG. 1. Since the second impurity region IR2 is enclosed by an insulating material without a body contact, the second impurity region IR2 may be used as a floating body of a transistor constituting the memory cell MC of FIG. 1. The first and third impurity regions IR1 and IR3 may be respectively used as source and drain regions of the transistor constituting the memory cell MC of FIG. 1.

Each of the first conductive lines CL1 may be a line- or bar-shaped pattern extending in the first direction D1. For example, each first conductive line CL1 may extend continuously in the first direction D1 to connect (e.g., electrically connect) to adjacent ones of the semiconductor patterns SP that are spaced apart from each other in the first direction D1. The first conductive lines CL1 may be sequentially stacked to be spaced apart from each other in the third direction D3. The first conductive lines CL1 may be formed of or include a conductive material. For example, the conductive material may be one of doped semiconductor materials (doped silicon, doped germanium, and so forth), conductive metal nitrides (titanium nitride, tantalum nitride, and so forth), metallic materials (tungsten, titanium, tantalum, and so forth), or metal-semiconductor compounds (tungsten silicide, cobalt silicide, titanium silicide, and so forth). The first conductive lines CL1 may be used as the bit lines BL described with reference to FIG. 1.

For concise description, one of the first to third layers L1, L2, and L3 of the stack SS (e.g., the first layer L1) will be described in more detail below. The semiconductor patterns SP of the first layer L1 may be spaced apart from each other in the first direction D1. The semiconductor patterns SP of the first layer L1 may be located at the same level (hereinafter, a first level).

The first conductive line CL1 of the first layer L1 may be provided on the semiconductor patterns SP of the first layer L1. The first conductive line CL1 may be provided on top surfaces SPt of the semiconductor patterns SP that are opposite respective bottom surfaces SPb of the semiconductor patterns SP. The first conductive line CL1 may be connected to the first impurity regions IR1. The first conductive line CL1 may be located at a second level, which is higher than the first level of the semiconductor patterns SP. The second layer L2 and the third layer L3 may be configured to have substantially the same features as those of the first layer L1 described above.

Second conductive lines CL2 may be provided on the substrate 100 to penetrate the stack SS. Each of the second conductive lines CL2 may be a line- or bar-shaped pattern extending in the third direction D3. The second conductive lines CL2 may be arranged in the first direction D1. When viewed in a plan view, each of the second conductive lines CL2 may be provided between a corresponding pair of the semiconductor patterns SP, which are arranged adjacent to each other in the first direction D1. Each of the second conductive lines CL2 may be vertically extended to face side walls of the semiconductor patterns SP, which are vertically stacked.

As an example, one of the second conductive lines CL2 may be provided to be adjacent to or face the first one of the semiconductor patterns SP of the first layer L1, the first one of the semiconductor patterns SP of the second layer L2, and the first one of the semiconductor patterns SP of the third layer L3. For example, the second conductive line CL2 may extend continuously in the third direction D3 along the first, second, and third layers L1, L2, and L3. Another of the second conductive lines CL2 may be provided to be adjacent to or face the second one of the semiconductor patterns SP of the first layer L1, the second one of the semiconductor patterns SP of the second layer L2, and the second one of the semiconductor patterns SP of the third layer L3.

The second conductive lines CL2 may be formed of or include a conductive material, and the conductive material may be one of doped semiconductor materials, conductive metal nitrides, metallic materials, or metal-semiconductor compounds. The second conductive lines CL2 may be used as the word lines WL described with reference to FIG. 1.

Third conductive lines CL3 may be provided on the substrate 100 to penetrate the stack SS. The third conductive lines CL3 may penetrate a region of the stack SS, which is located between the first and second sub-cell arrays SCA1 and SCA2. Each of the third conductive lines CL3 may be a line- or bar-shaped pattern extending in the third direction D3. The third conductive lines CL3 may be arranged in the first direction D1. When viewed in a plan view, each of the third conductive lines CL3 may be provided between a corresponding pair of the semiconductor patterns SP, which are arranged adjacent to each other in the second direction D2.

Each of the third conductive lines CL3 may be vertically extended between the third impurity region IR3 of the semiconductor pattern SP of the first sub-cell array SCA1 and the third impurity region IR3 of the semiconductor pattern SP of the second sub-cell array SCA2. Each of the third conductive lines CL3 may be connected in common to the third impurity region IR3 of the semiconductor pattern SP of the first sub-cell array SCA1 and the third impurity region IR3 of the semiconductor pattern SP of the second sub-cell array SCA2.

The third conductive lines CL3 may be formed of or include a conductive material, and the conductive material may be one of doped semiconductor materials, conductive metal nitrides, metallic materials, or metal-semiconductor compounds. The third conductive lines CL3 may be used as the common drain lines CDL described with reference to FIG. 1.

In some embodiments, an insulating material may be provided in (e.g., to fill) empty spaces in the stack SS. For example, the insulating material may include at least one of a silicon oxide layer, a silicon nitride layer, or a silicon oxynitride layer.

The memory cell of the memory device of FIG. 2 will be described in more detail with reference to FIGS. 3 to 5. The first to third impurity regions IR1, IR2, and IR3 may be impurity-doped regions, which are formed in the semiconductor pattern SP. In some embodiments, the first and third impurity regions IR1 and IR3 may have a first conductivity type (e.g., n-type), and the second impurity region IR2 may have a second conductivity type (e.g., p-type) that is different from the first conductivity type.

The semiconductor pattern SP may have a first end SPe1 and a second end SPe2 opposite to the first end SPe1. The first impurity region IR1 may be adjacent to the first end SPe1 of the semiconductor pattern SP. The third impurity region IR3 may be adjacent to the second end SPe2 of the semiconductor pattern SP.

Lightly-doped regions LD may be formed between the first and second impurity regions IR1 and IR2 and between the second and third impurity regions IR2 and IR3. As an example, the lightly-doped regions LD may have the first conductivity type (e.g., n-type). The lightly-doped regions LD may have an impurity concentration lower than that of the first and third impurity regions IR1 and IR3.

The first conductive line CL1 may be provided on the top surface SPt of the semiconductor pattern SP. The first conductive line CL1 may be provided on a top surface of the first impurity region IR1 and may be electrically connected to the first impurity region IR1. As an example, the first conductive line CL1 may be connected to the first impurity region IR1 through a first silicide layer SC1. The first silicide layer SC1 may be formed of or include a metal silicide (e.g., cobalt silicide).

The second conductive line CL2 may be adjacent to the second impurity region IR2. The second conductive line CL2 may be extended in the third direction D3 to face a side wall of the second impurity region IR2. A gate insulating layer GI may be provided between the second conductive line CL2 and the second impurity region IR2. The gate insulating layer GI may be formed of or include at least one of high-k dielectric materials, silicon oxide, silicon nitride, or silicon oxynitride and may be provided to have a single- or multi-layered structure. For example, the high-k dielectric materials may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The third conductive line CL3 may be provided to be in contact with the second end SPe2 of the semiconductor pattern SP. The third conductive line CL3 may be extended in the third direction D3. As an example, the third conductive line CL3 may be connected to the third impurity region IR3 through a second silicide layer SC2. An outer sidewall of the second silicide layer SC2 may be the second end SPe2 of the semiconductor pattern SP, and the third conductive line CL3 may be in direct contact with the second end SPe2. The second silicide layer SC2 may be formed of or include a metal silicide (e.g., cobalt silicide).

The memory device according to FIGS. 1-5 may be a 1T DRAM whose threshold voltage (Vth) is changed using a floating body effect, and here, "1" and "0" states of the 1T DRAM may be determined by comparing the threshold voltage (Vth) to a reference voltage. Since the memory device according to FIGS. 1-5 has a floating body structure, a change in a body potential may lead to a variation in threshold voltage (Vth) that may be measured by a sensing circuit.

In the memory device according to FIGS. 1-5, holes may be produced by one of various methods such as impact ionization, gate-induced-drain-leakage, and avalanche breakdown. The holes may be accumulated in the second impurity region IR2, which is a quasi-neutral region in a relatively stable state. The accumulated holes may lead to a reduction in threshold voltage (Vth) of the transistor, and in this case, the memory cell may become the "1" state. The accumulated holes may be exhausted from the second impurity region IR2 through the first impurity region IR1 (e.g., the source region) or the third impurity region IR3 (e.g., the drain region). If the holes accumulated in the second impurity region IR2 are exhausted, the threshold voltage (Vth) of the transistor may be increased, and in this case, the memory cell may become the "0" state.

Hereinafter, various embodiments of the inventive concepts will be described. In the following description, an element previously described with reference to FIGS. 1 to 5 may not be described in detail, and an element that was not described with reference to FIGS. 1 to 5 will be described in more detail.

Figure 6:
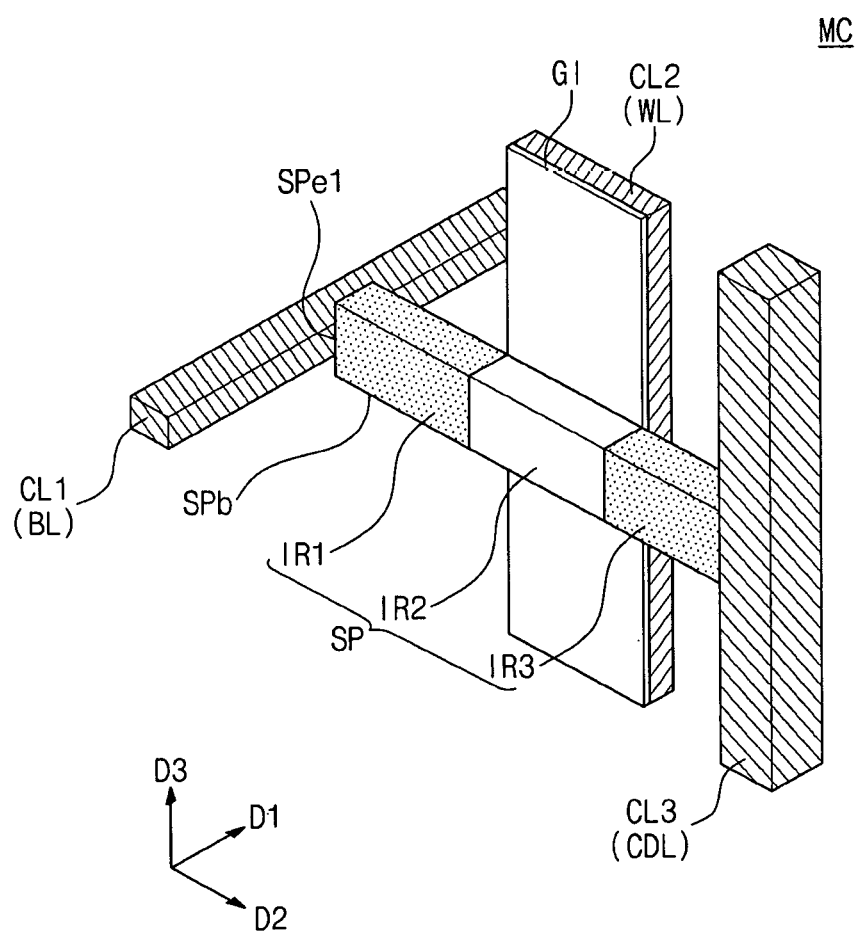
FIG. 6 is an enlarged perspective view illustrating a memory cell of a three-dimensional semiconductor memory device according to some embodiments of the inventive concepts.
Figure 7:
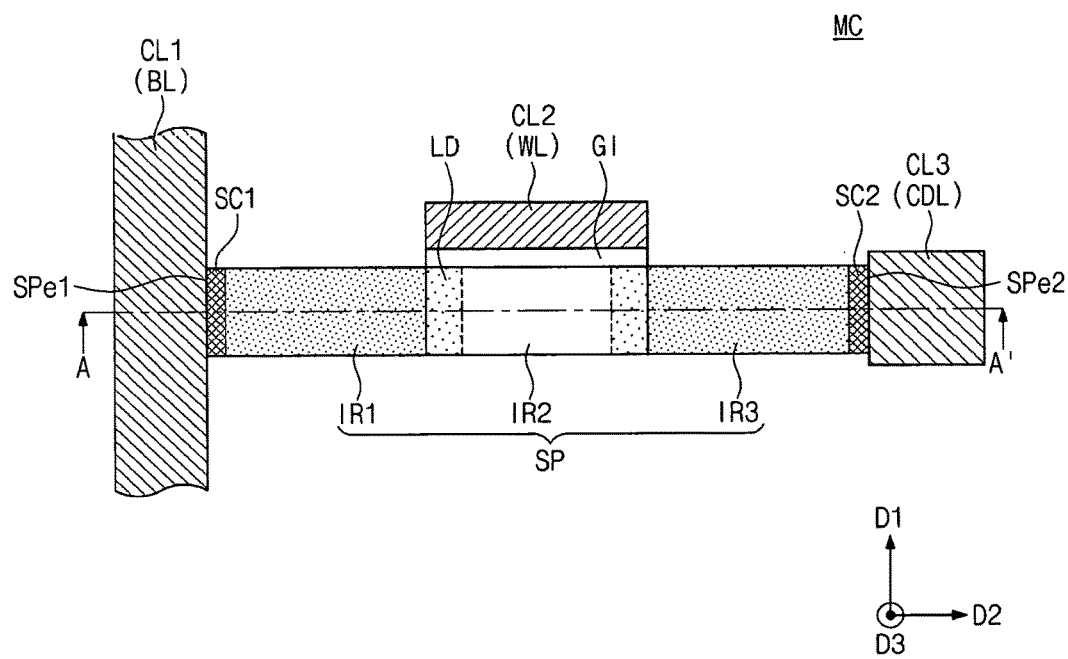
FIG. 7 is a plan view illustrating the memory cell of FIG. 6.
Figure 8:
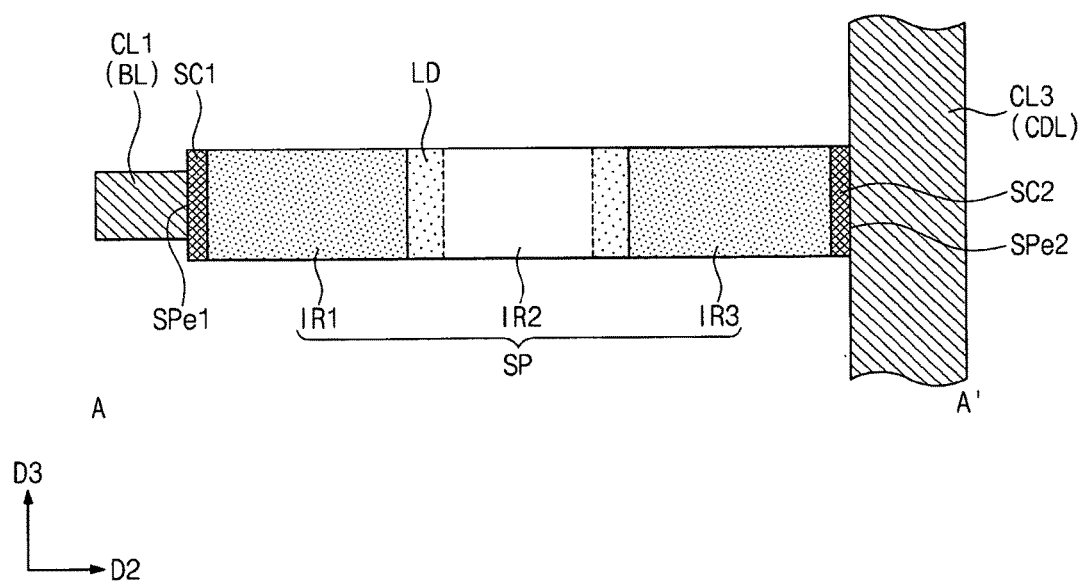
FIG. 8 is a sectional view taken along line A-A' of FIG. 7.

FIG. 6 is an enlarged perspective view illustrating a memory cell of a three-dimensional semiconductor memory device according to some embodiments of the inventive concepts. FIG. 7 is a plan view illustrating the memory cell of FIG. 6. FIG. 8 is a sectional view taken along line A-A' of FIG. 7. Referring to FIGS. 6 to 8, the first conductive line CL1 may be in direct contact with the first end SPe1 of the semiconductor pattern SP. The first conductive line CL1 may be provided on a side wall of the semiconductor pattern SP, but not on a top surface of the semiconductor pattern SP. The first conductive line CL1 may be located at substantially the same level as that of the semiconductor pattern SP.

Figure 9:
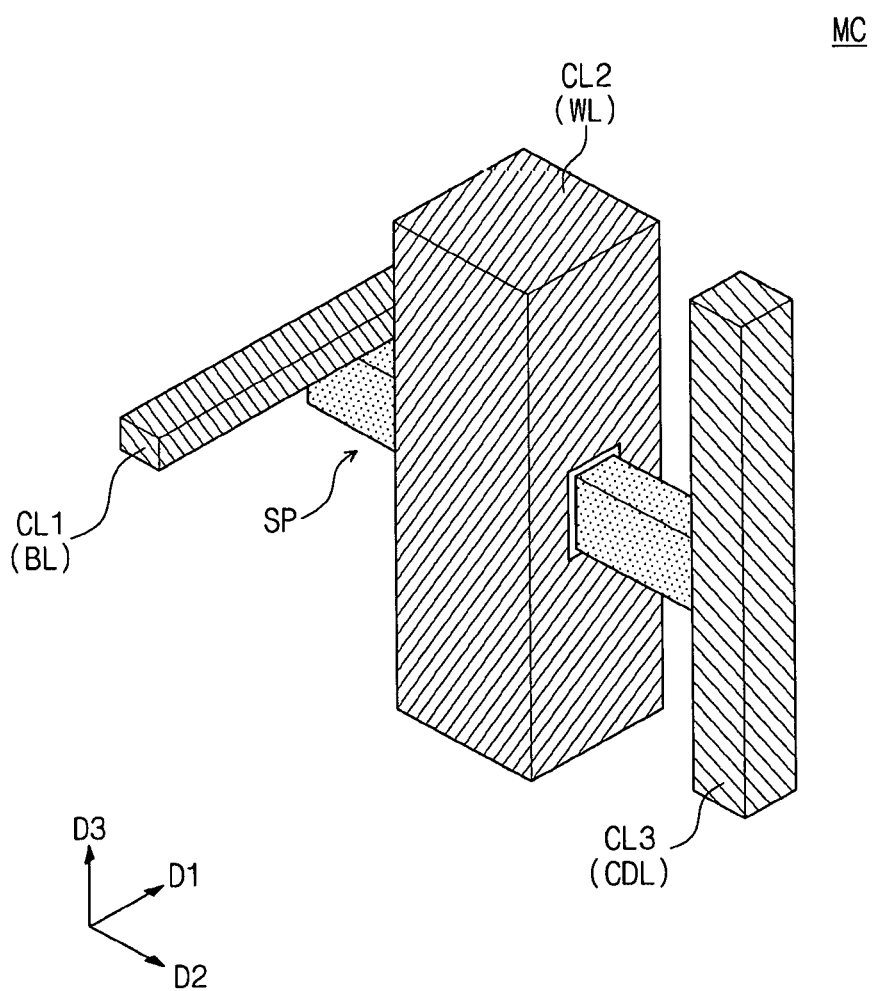
FIG. 9 is an enlarged perspective view illustrating a memory cell of a three-dimensional semiconductor memory device according to some embodiments of the inventive concepts.

FIG. 9 is an enlarged perspective view illustrating a memory cell of a three-dimensional semiconductor memory device according to some embodiments of the inventive concepts. Referring to FIG. 9, the second conductive line CL2 may be vertically extended to be on a plurality of sides of (e.g., to cover) the second impurity region IR2 of the semiconductor pattern SP. The second conductive line CL2 may be provided to surround the second impurity region IR2. For example, the second conductive line CL2 may be provided to cover top, bottom, and opposite side surfaces of the second impurity region IR2. In some embodiments, a plurality of vertically-overlapping ones of the semiconductor patterns SP may penetrate the second conductive line CL2. The gate insulating layer GI may be disposed between the second conductive line CL2 and the second impurity region IR2. That is, the transistor constituting the memory cell MC may be a gate-all-around type transistor.

Figure 10:
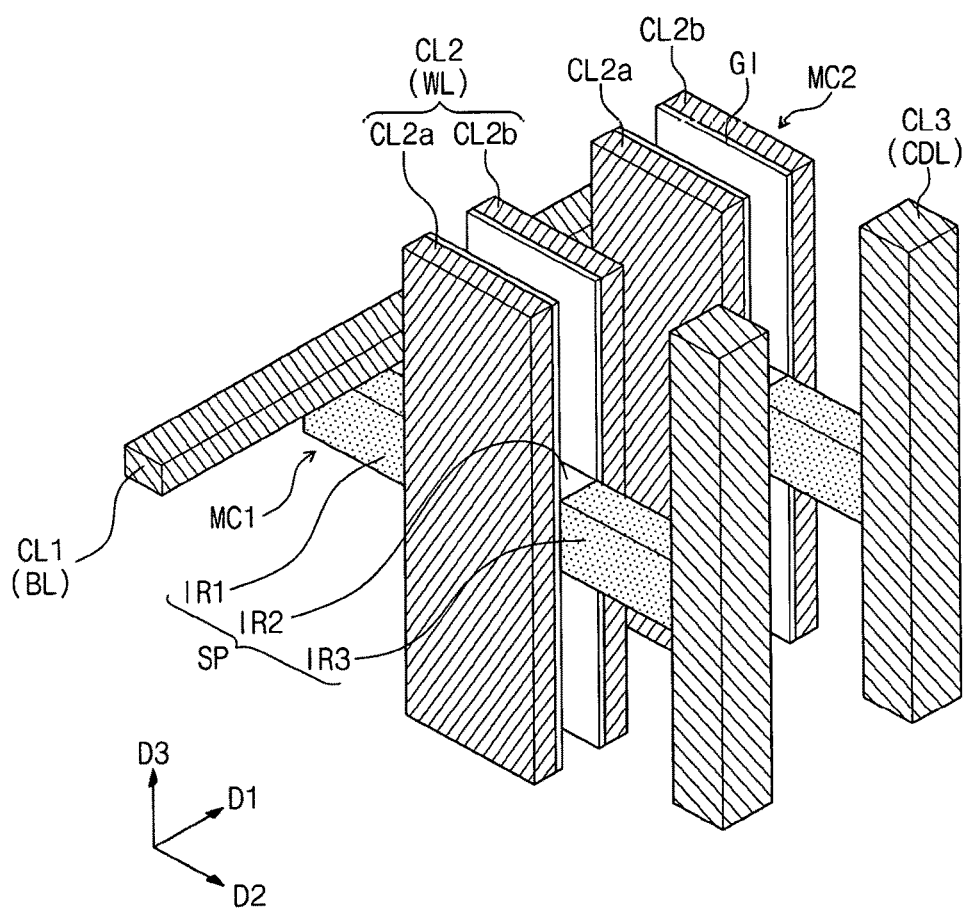
FIG. 10 is an enlarged perspective view illustrating first and second memory cells of a three-dimensional semiconductor memory device according to some embodiments of the inventive concepts.
Figure 11:
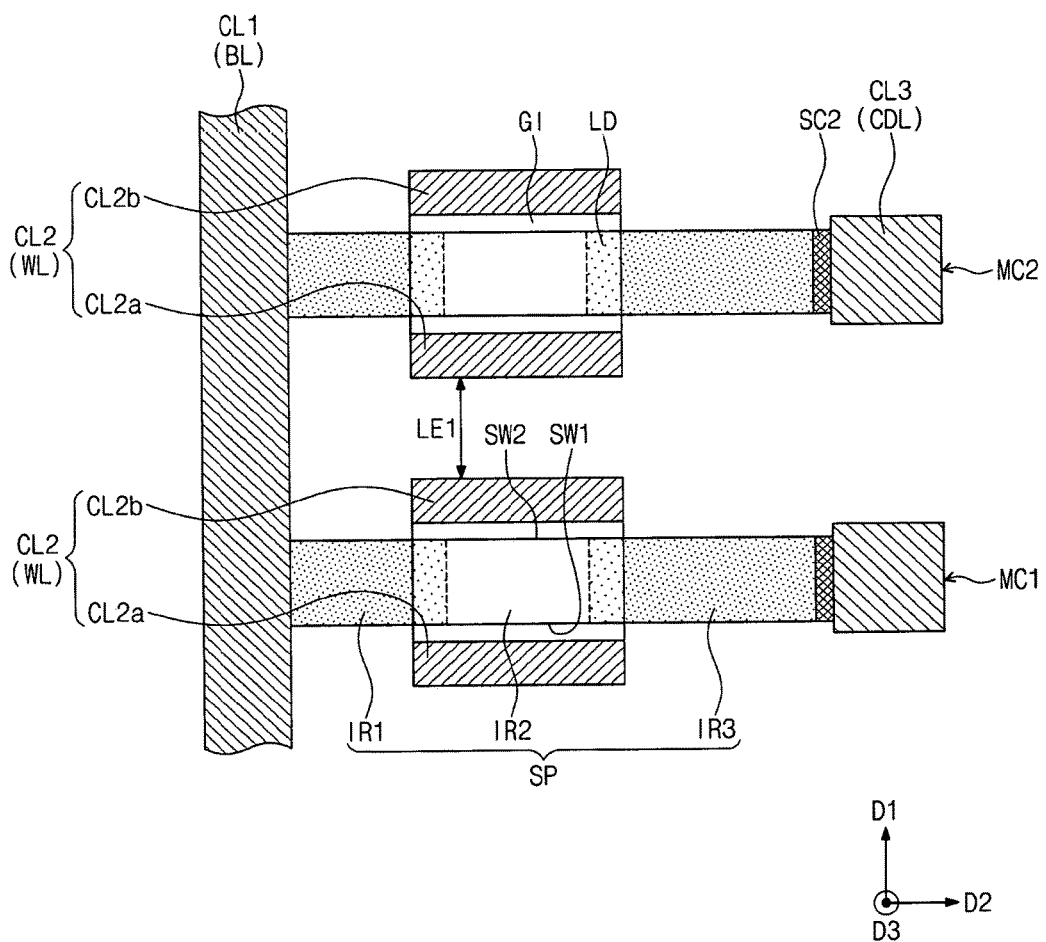
FIG. 11 is a plan view illustrating the first and second memory cells of FIG. 10.

FIG. 10 is an enlarged perspective view illustrating first and second memory cells of a three-dimensional semiconductor memory device according to some embodiments of the inventive concepts. FIG. 11 is a plan view illustrating the first and second memory cells of FIG. 10.

Referring to FIGS. 10 and 11, a first memory cell MC1 and a second memory cell MC2, which are arranged (e.g., spaced apart from each other) in the first direction D1, may be provided. Each of the first and second memory cells MC1 and MC2 may include the semiconductor pattern SP. The semiconductor pattern SP may have a first side wall SW1 and a second side wall SW2 opposite to the first side wall SW1. The first and second side walls SW1 and SW2 may be opposite side surfaces of the second impurity region IR2.

The second conductive lines CL2 adjacent to the semiconductor patterns SP may be provided. Each of the second conductive lines CL2 may include a first sub-conductive line CL2a and a second sub-conductive line CL2b. The first and second sub-conductive lines CL2a and CL2b may be adjacent to the first and second side walls SW1 and SW2 of the semiconductor pattern SP, respectively. The gate insulating layers GI may be provided between the first and second sub-conductive lines CL2a and CL2b and the second impurity region IR2. In other words, a transistor of each of the first and second memory cells MC1 and MC2 may have a double-gate structure, in which a pair of gates are provided to face opposite side surfaces of a channel region.

The first sub-conductive line CL2a and the second sub-conductive line CL2b may constitute one of the word lines WL shown in FIG. 1. That is, the first sub-conductive line CL2a and the second sub-conductive line CL2b may be connected to the same node, and thus, the same electrical signal may be applied to the first sub-conductive line CL2a and the second sub-conductive line CL2b.

The second sub-conductive line CL2b of the first memory cell MC1 and the first sub-conductive line CL2a of the second memory cell MC2 may be adjacent to each other in the first direction D1. The second sub-conductive line CL2b of the first memory cell MC1 may be spaced apart from the first sub-conductive line CL2a of the second memory cell MC2 by a first distance LE1 in the first direction D1.

In some embodiments, a space between the first and second memory cells MC1 and MC2 may include (e.g., may be filled with) an insulating material (e.g., silicon oxide, silicon nitride, or silicon oxynitride). A thickness of an insulating material, which is provided between the second sub-conductive line CL2b of the first memory cell MC1 and the first sub-conductive line CL2a of the second memory cell MC2, may be substantially equal to the first distance LE1. The first distance LE1 or the thickness of the insulating material may be determined to inhibit/prevent an unintended coupling between adjacent ones of the second conductive lines CL2.

Figure 12:
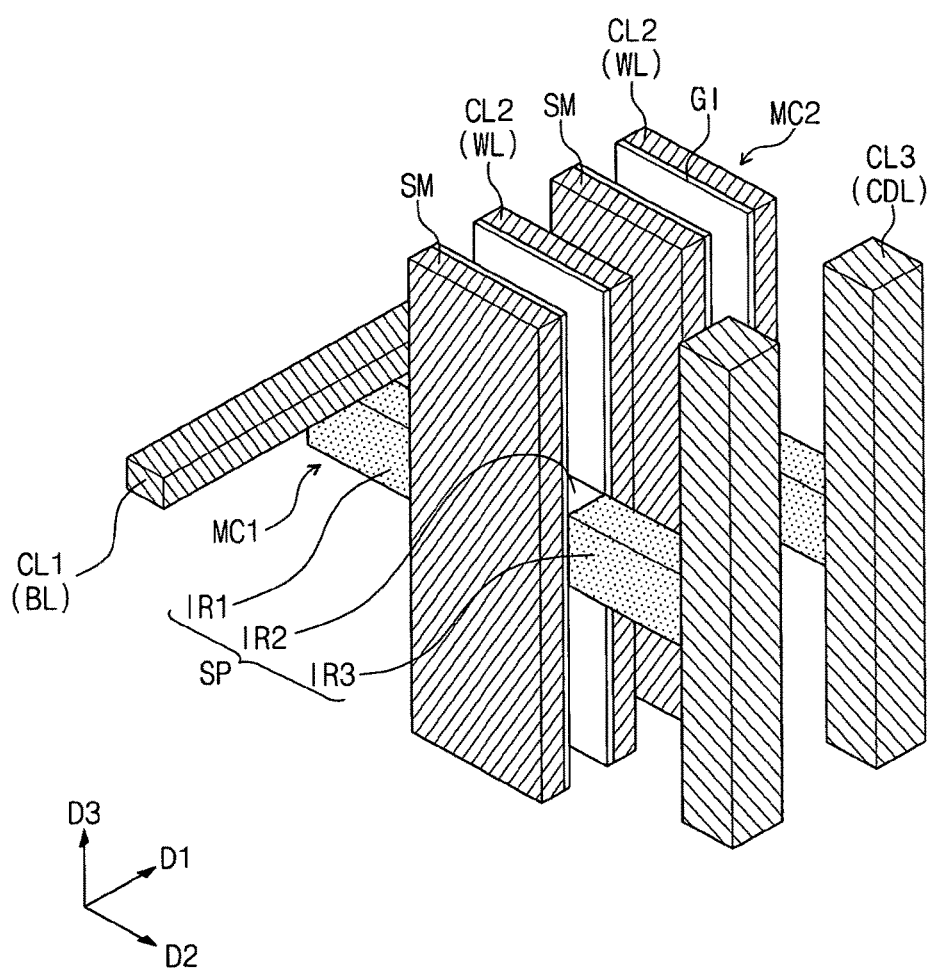
FIG. 12 is an enlarged perspective view illustrating first and second memory cells of a three-dimensional semiconductor memory device according to some embodiments of the inventive concepts.
Figure 13:
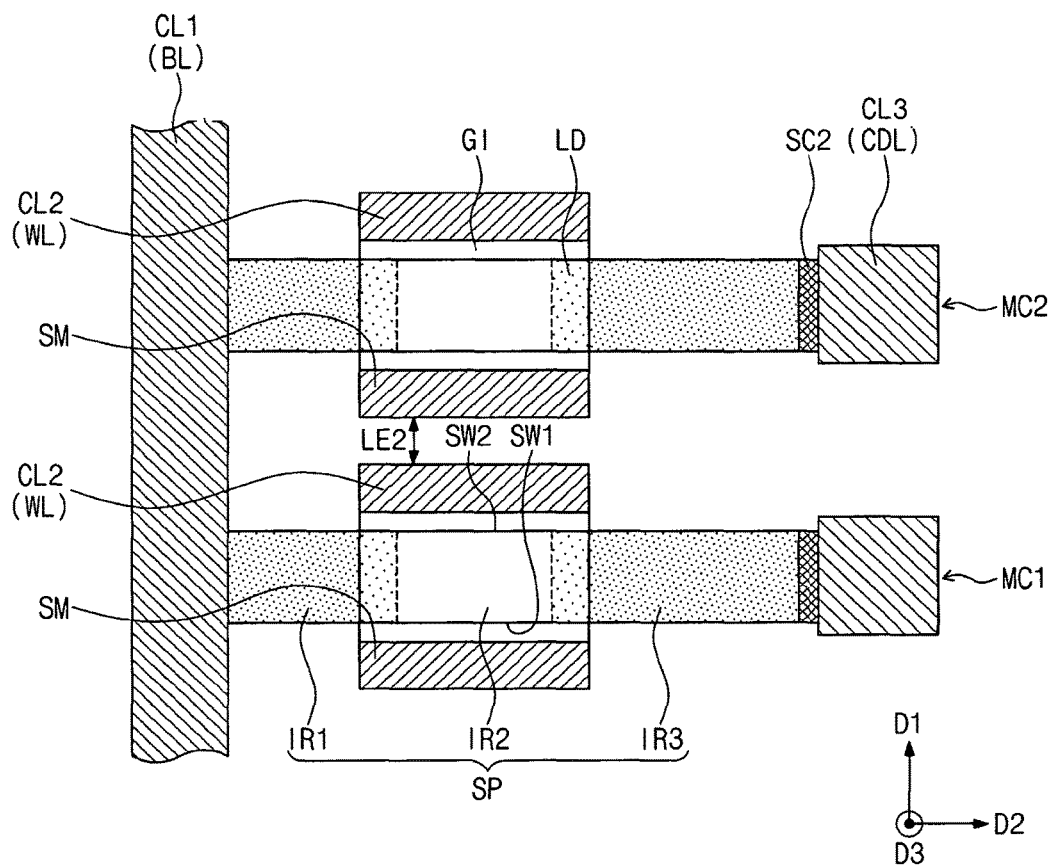
FIG. 13 is a plan view illustrating the first and second memory cells of FIG. 12.

FIG. 12 is an enlarged perspective view illustrating first and second memory cells of a three-dimensional semiconductor memory device according to some embodiments of the inventive concepts. FIG. 13 is a plan view illustrating the first and second memory cells of FIG. 12. In the following description, an element previously described with reference to FIGS. 10 and 11 may be identified by the same reference number without repeating an overlapping description thereof, for the sake of brevity.

Referring to FIGS. 12 and 13, a shield line SM may be provided adjacent to the first side wall SW1 of each of the semiconductor patterns SP, and the second conductive line CL2 may be provided adjacent to the second side wall SW2. The shield line SM may be provided between the second conductive line CL2 of the first memory cell MC1 and the second conductive line CL2 of the second memory cell MC2. The shield line SM may be used to inhibit/prevent adjacent ones of the second conductive lines CL2 from being electrically coupled to each other.

The second conductive line CL2 and the shield line SM of each of the first and second memory cells MC1 and MC2 may be connected to different nodes. For example, the second conductive line CL2 may be connected to a node for applying a signal to the word line, and the shield line SM may be connected to another node applied with a ground voltage.

The second conductive line CL2 of the first memory cell MC1 and the shield line SM of the second memory cell MC2 may be adjacent to each other in the first direction D1. The second conductive line CL2 of the first memory cell MC1 may be spaced apart from the shield line SM of the second memory cell MC2 by a second distance LE2 in the first direction D1. The second distance LE2 may be shorter than the first distance LE1 described with reference to FIGS. 10 and 11. That is, owing to the presence of the shield line SM, it may be possible to reduce a distance between the first and second memory cells MC1 and MC2 which are located adjacent to each other, and thereby to increase an integration density of the memory device.

Figure 14:
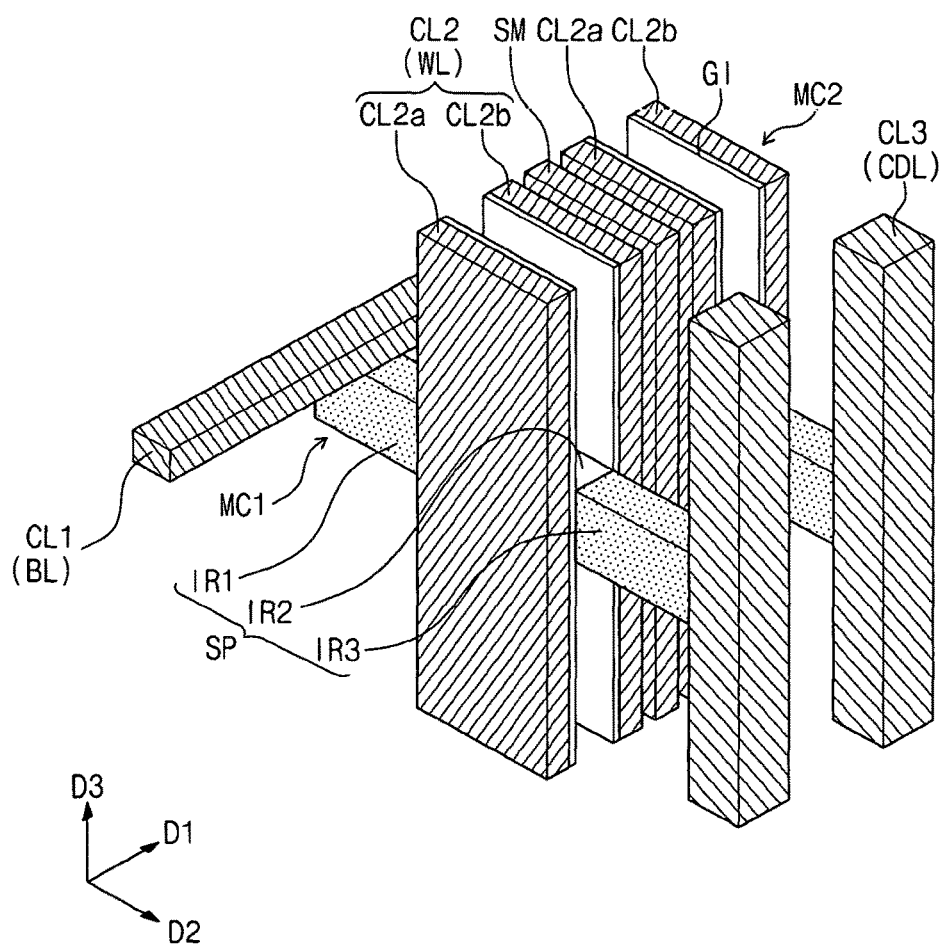
FIG. 14 is an enlarged perspective view illustrating first and second memory cells of a three-dimensional semiconductor memory device according to some embodiments of the inventive concepts.
Figure 15:
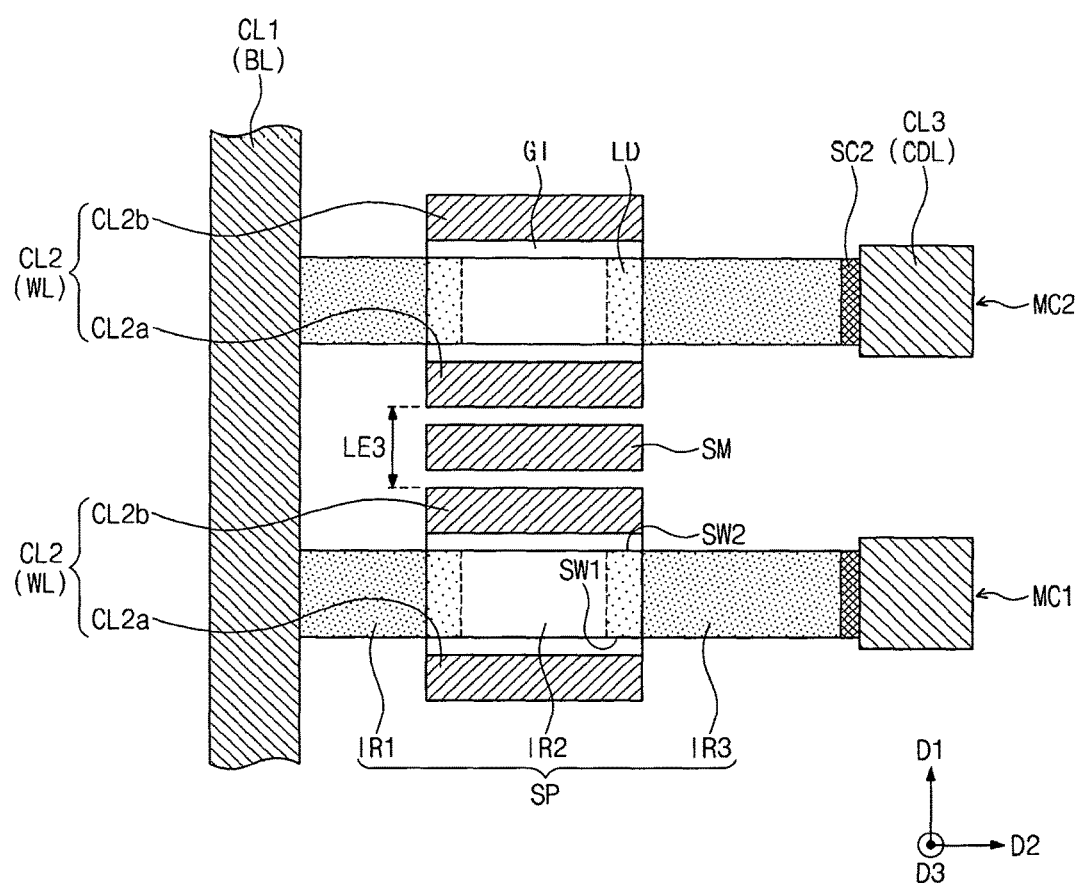
FIG. 15 is a plan view illustrating the first and second memory cells of FIG. 14.

FIG. 14 is an enlarged perspective view illustrating first and second memory cells of a three-dimensional semiconductor memory device according to some embodiments of the inventive concepts. FIG. 15 is a plan view illustrating the first and second memory cells of FIG. 14. In the following description, an element previously described with reference to FIGS. 10 and 11 may be identified by the same reference number without repeating an overlapping description thereof, for the sake of brevity.

Referring to FIGS. 14 and 15, each of the second conductive lines CL2 may include the first and second sub-conductive lines CL2a and CL2b. The first and second sub-conductive lines CL2a and CL2b may be provided adjacent to the first and second side walls SW1 and SW2, respectively, of the semiconductor pattern SP. The shield line SM may be provided between the first and second memory cells MC1 and MC2. The shield line SM may be provided between the second sub-conductive line CL2b of the first memory cell MC1 and the first sub-conductive line CL2a of the second memory cell MC2. The shield line SM may be used to inhibit/prevent the first and second sub-conductive lines CL2a and CL2b adjacent thereto from being coupled to each other.

The first sub-conductive line CL2a and the second sub-conductive line CL2b may be connected to the same node. The shield line SM may be connected to another node, which is not connected with the first and second sub-conductive lines CL2a and CL2b. For example, the shield line SM may be connected to a node applied with a ground voltage.

The second sub-conductive line CL2b of the first memory cell MC1 may be spaced apart from the first sub-conductive line CL2a of the second memory cell MC2 by a third distance LE3. The third distance LE3 may be shorter than the first distance LE1 described with reference to FIGS. 10 and 11. That is, owing to the presence of the shield line SM, it may be possible to reduce a distance between the first and second memory cells MC1 and MC2 which are located adjacent to each other, and thereby to increase an integration density of the memory device.

Figure 16:
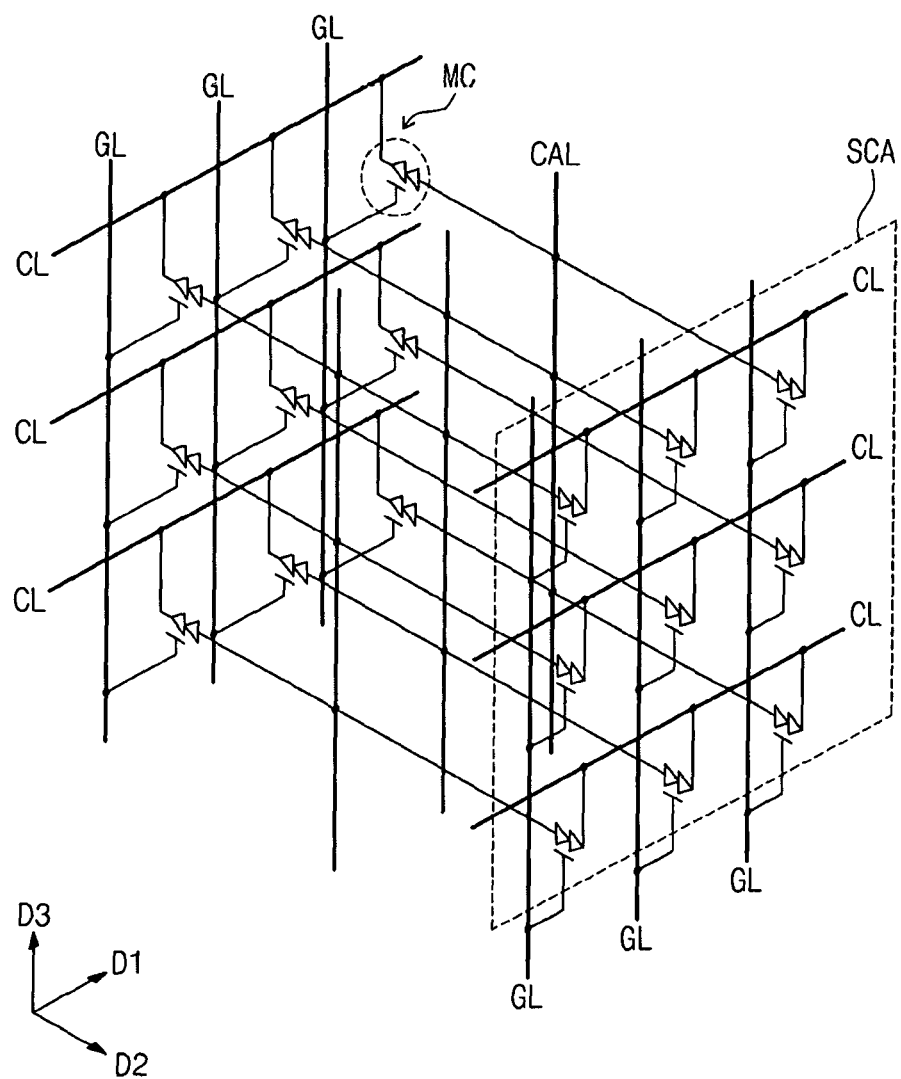
FIG. 16 is a circuit diagram schematically illustrating a cell array of a three-dimensional semiconductor memory device according to some embodiments of the inventive concepts.

FIG. 16 is a circuit diagram schematically illustrating a cell array of a three-dimensional semiconductor memory device according to some embodiments of the inventive concepts.

Referring to FIG. 16, a cell array of a three-dimensional semiconductor memory device according to some embodiments of the inventive concepts may include a plurality of the sub-cell arrays SCA. The sub-cell arrays SCA may be arranged in the second direction D2.

Each of the sub-cell arrays SCA may include a plurality of cathode lines CL, a plurality of gate lines GL, and a plurality of the memory cells MC. Each of the memory cells MC may be provided between a corresponding one of the gate lines GL and a corresponding one of the cathode lines CL.

Each of the memory cells MC may be a data storing element that is composed of one thyristor. As an example, each of the memory cells MC may have a capacitor-free structure. For example, the memory device according to the present embodiment may be a thyristor DRAM, from which a capacitor is omitted. The thyristor may include a first diode, a second diode, and a gate connected to the first diode.

The cathode lines CL may be conductive patterns (e.g., metal lines), which are provided over a substrate or are vertically spaced apart from the substrate. The cathode lines CL may be extended in the first direction D1. In each sub-cell array SCA, the cathode lines CL may be spaced apart from each other in the vertical or third direction D3.

The gate lines GL may be conductive patterns (e.g., metal lines) extending in the vertical or third direction D3. In each sub-cell array SCA, the gate lines GL may be spaced apart from each other in the first direction D1.

Common conductive lines, such as common anode lines CAL, may be provided between each one among a pair of adjacent ones of the sub-cell arrays SCA that are adjacent to each other in the second direction D2. The common anode lines CAL may be conductive patterns (e.g., metal lines) extending in the vertical or third direction D3. The common anode lines CAL may be spaced apart from each other in the first direction D1.

Each of the common anode lines CAL may be connected in common to a pair of the memory cells MC, which are adjacent to each other in the second direction D2. For example, each of the common anode lines CAL may be connected in common to a pair of adjacent ones of the memory cells MC that are located at the same level.

Figure 17:
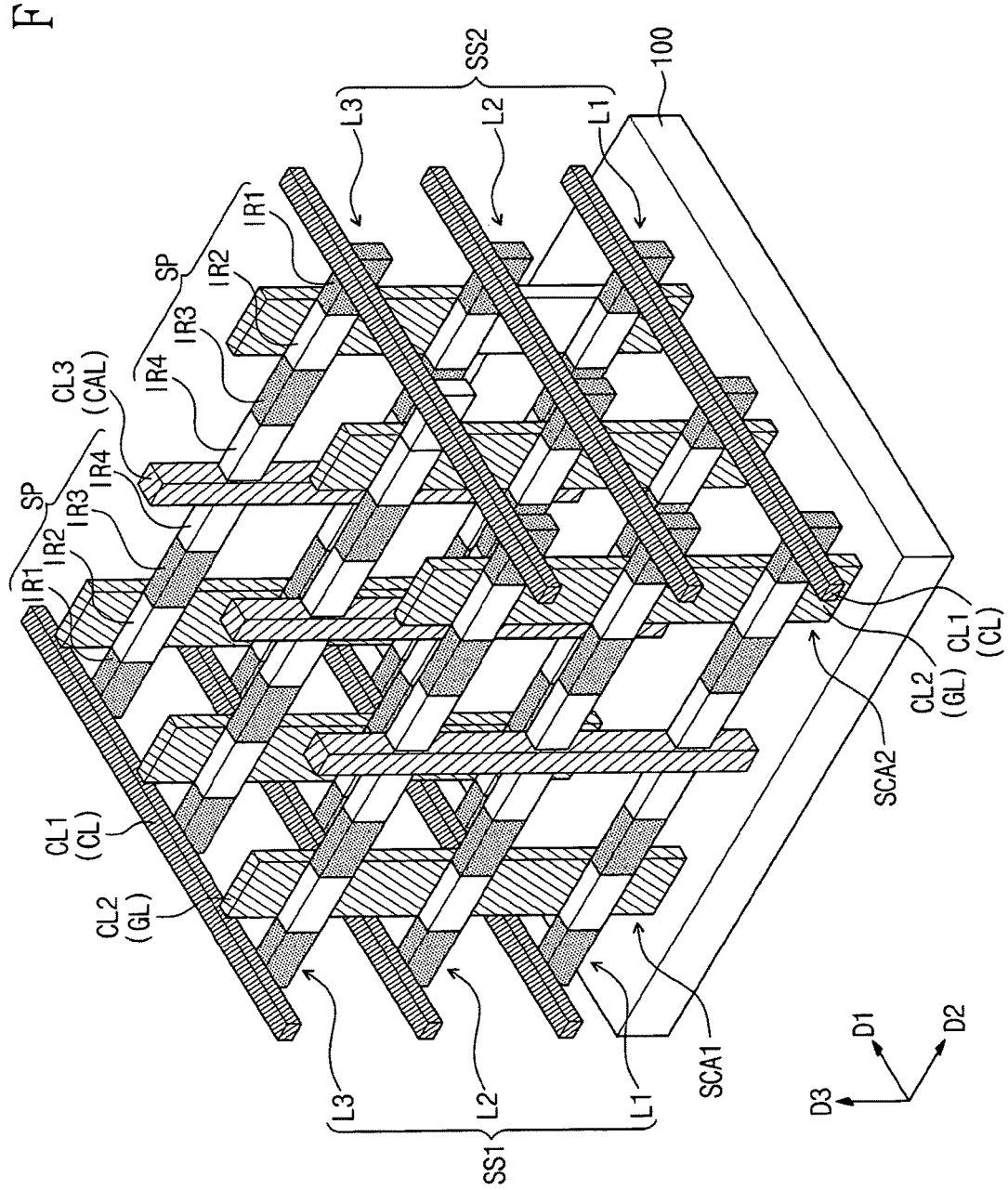
FIG. 17 is a perspective view illustrating a three-dimensional semiconductor memory device according to some embodiments of the inventive concepts.
Figure 18:
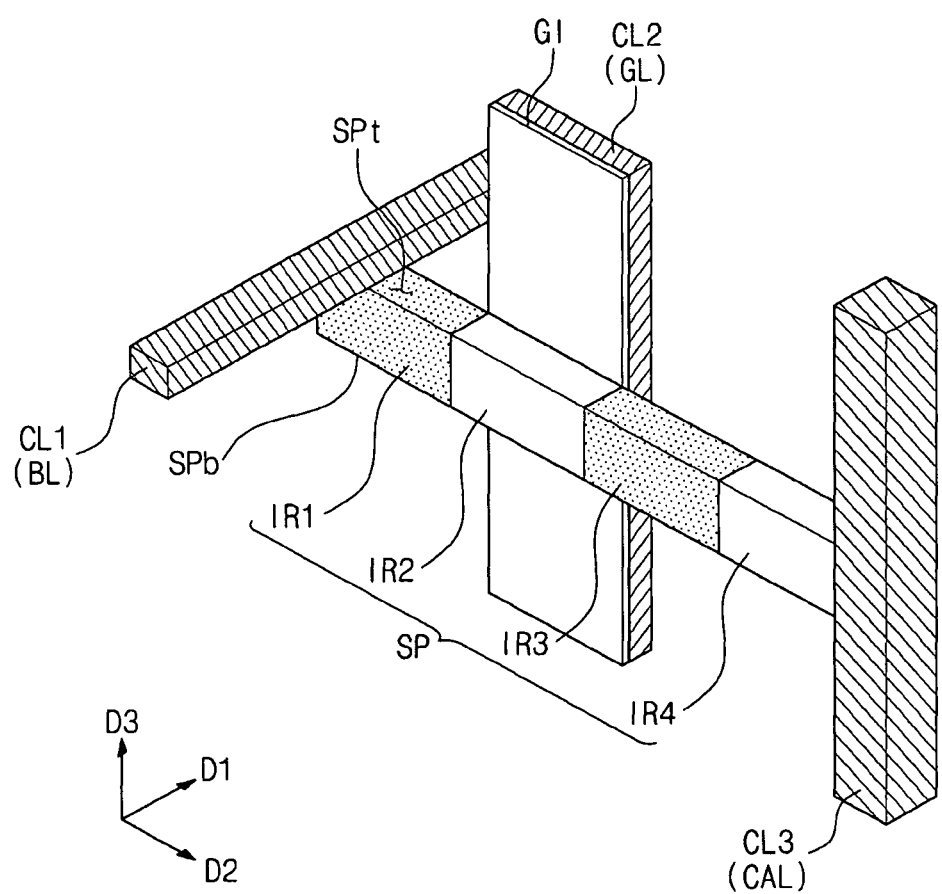
FIG. 18 is an enlarged perspective view illustrating a memory cell of the memory device of FIG. 17.
Figure 19:
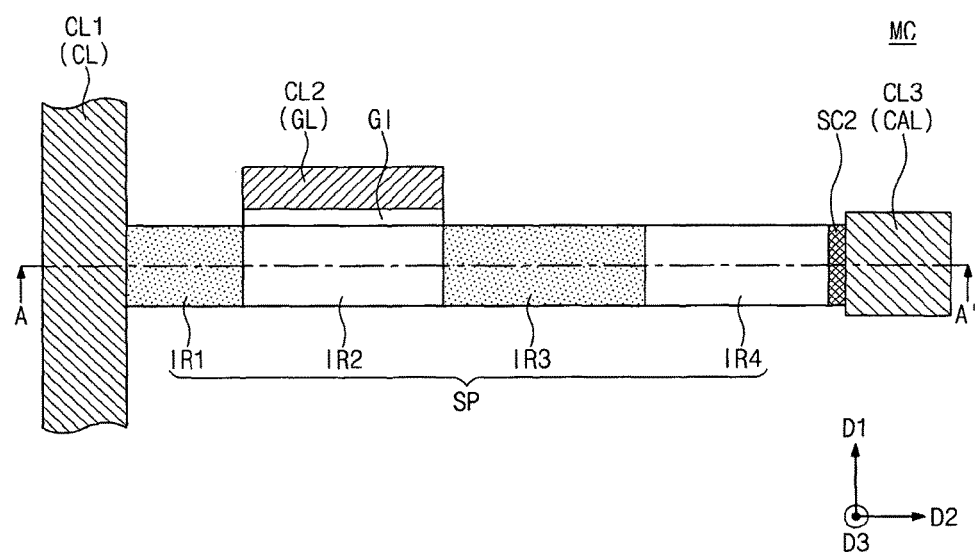
FIG. 19 is a plan view illustrating the memory cell of FIG. 18.
Figure 20:
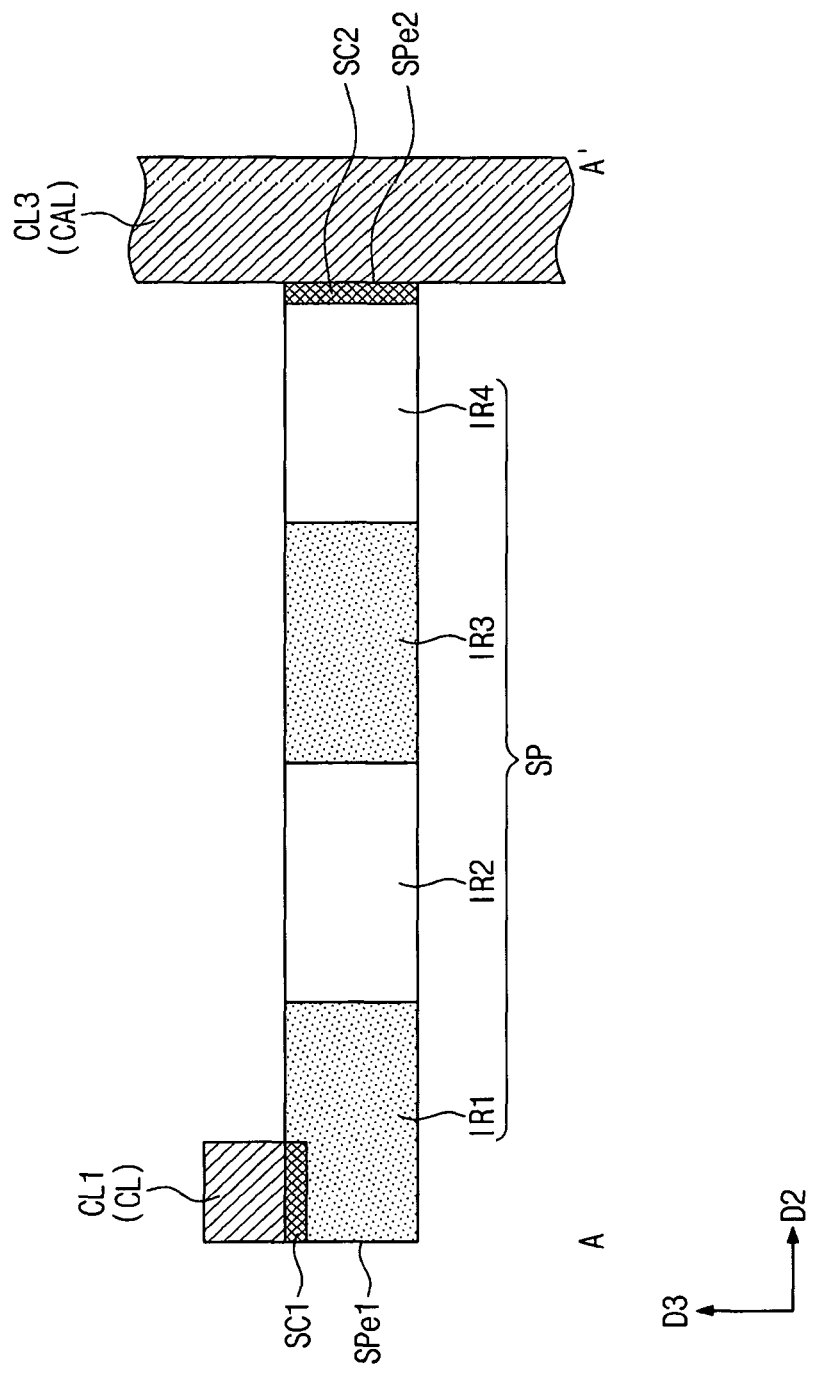
FIG. 20 is a sectional view taken along line A-A' of FIG. 19.

FIG. 17 is a perspective view illustrating a three-dimensional semiconductor memory device according to some embodiments of the inventive concepts. FIG. 18 is an enlarged perspective view illustrating a memory cell of the memory device of FIG. 17. FIG. 19 is a plan view illustrating the memory cell of FIG. 18. FIG. 20 is a sectional view taken along line A-A' of FIG. 19. In the following description, an element previously described with reference to FIGS. 1 to 5 may be identified by the same reference number without repeating an overlapping description thereof, for the sake of brevity.

Referring to FIGS. 16 to 20, the first sub-cell array SCA1 and the second sub-cell array SCA2, which are two adjacent ones of the sub-cell arrays SCA described with reference to FIG. 16, may be provided on the substrate 100. The pair of the first and second sub-cell arrays SCA1 and SCA2 may be provided in the form of stacks SS1 and SS2, respectively. The stacks SS1 and SS2 may each include the first to third layers L1, L2, and L3, which are vertically stacked on the substrate 100. Each of the first to third layers L1, L2, and L3 may include a pair of the first conductive lines CL1, which are spaced apart from each other in the second direction D2, and a plurality of the semiconductor patterns SP, which are connected to each of the first conductive lines CL1.

Each of the semiconductor patterns SP may include the first impurity region IR1, the second impurity region IR2, the third impurity region IR3, and a fourth impurity region IR4. The second impurity region IR2 may be provided between the first and third impurity regions IR1 and IR3. The third impurity region IR3 may be provided between the second and fourth impurity regions IR2 and IR4.

The first and second impurity regions IR1 and IR2 may correspond to the first diode constituting the memory cell MC of FIG. 16, and the third and fourth impurity regions IR3 and IR4 may correspond to the second diode constituting the memory cell MC of FIG. 16. As described above, the memory cell MC may be composed of a thyristor. The thyristor may include a first bipolar transistor, which is composed of the first to third impurity regions IR1, IR2, and IR3, and a second bipolar transistor, which is composed of the second to fourth impurity regions IR2, IR3, and IR4. The thyristor of the memory cell MC may have a floating body. The first impurity region IR1 may be used as a cathode of the thyristor, and the fourth impurity region IR4 may be used as an anode of the thyristor.

The first conductive lines CL1 may be sequentially stacked to be spaced apart from each other in the third direction D3. The first conductive lines CL1 may be used as the cathode lines CL described with reference to FIG. 16.

The second conductive lines CL2 penetrating the stacks SS1 and SS2 may be arranged (e.g., spaced apart from each other) in the first direction D1. The second conductive lines CL2 may be used as the gate lines GL described with reference to FIG. 16.

The third conductive lines CL3 may be provided on the substrate 100 to penetrate a region between the first and second sub-cell arrays SCA1 and SCA2. When viewed in a plan view, each of the third conductive lines CL3 may be provided between ones among a corresponding pair of the semiconductor patterns SP that are arranged adjacent to each other in the second direction D2.

Each of the third conductive lines CL3 may be vertically extended between the fourth impurity region IR4 of the semiconductor pattern SP of the first sub-cell array SCA1 and the fourth impurity region IR4 of the semiconductor pattern SP of the second sub-cell array SCA2. Each of the third conductive lines CL3 may be connected in common to the fourth impurity region IR4 of the semiconductor pattern SP of the first sub-cell array SCA1 and the fourth impurity region IR4 of the semiconductor pattern SP of the second sub-cell array SCA2. The third conductive lines CL3 may be used as the common anode lines CAL described with reference to FIG. 16.

In some embodiments, an insulating material may be provided in (e.g., to fill) empty spaces in the stacks SS1 and SS2. For example, the insulating material may include at least one of a silicon oxide layer, a silicon nitride layer, or a silicon oxynitride layer.

The memory cell of the memory device of FIG. 17 will be described in more detail with reference to FIGS. 18 to 20. The first to fourth impurity regions IR1, IR2, IR3, and IR4 may be impurity-doped regions, which are formed in the semiconductor pattern SP. In some embodiments, the first and third impurity regions IR1 and IR3 may have a first conductivity type (e.g., n-type). An impurity concentration of the first impurity region IR1 may be higher than an impurity concentration of the third impurity region IR3. The second and fourth impurity regions IR2 and IR4 may have a second conductivity type (e.g., p-type), which is different from the first conductivity type. An impurity concentration of the fourth impurity region IR4 may be higher than an impurity concentration of the second impurity region IR2.

The semiconductor pattern SP may have the first end SPe1 and the second end SPe2 opposite to the first end SPe1. The first impurity region IR1 may be adjacent to the first end SPe1 of the semiconductor pattern SP. The fourth impurity region IR4 may be adjacent to the second end SPe2 of the semiconductor pattern SP.

The first conductive line CL1 may be provided on the top surface SPt of the semiconductor pattern SP. The first conductive line CL1 may be connected to the first impurity region IR1 through the first silicide layer SC1.

The second conductive line CL2 may be adjacent to the second impurity region IR2. The second conductive line CL2 may be extended in the third direction D3 to face a side wall of the second impurity region IR2. The gate insulating layer GI may be provided between the second conductive line CL2 and the second impurity region IR2.

The third conductive line CL3 may be provided to be in contact with the second end SPe2 of the semiconductor pattern SP. The third conductive line CL3 may be extended in the third direction D3. As an example, the third conductive line CL3 may be connected to the fourth impurity region IR4 through the second silicide layer SC2.

In embodiments in which the same forward bias voltage is applied to a thyristor, an amount of current flowing through the thyristor may be large when the thyristor is in a high conductance state or may be small when in a low conductance state. The memory device according to FIGS. 16-20 may be the thyristor DRAM whose "1" and "0" data states are realized using the high and low conductance states of the thyristor.

Hereinafter, various embodiments of the inventive concepts will be described. In the following description, an element previously described with reference to FIGS. 16 to 20 may not be described in detail, and an element, which was not described with reference to FIGS. 16 to 20, will be described in more detail.

Figure 21:
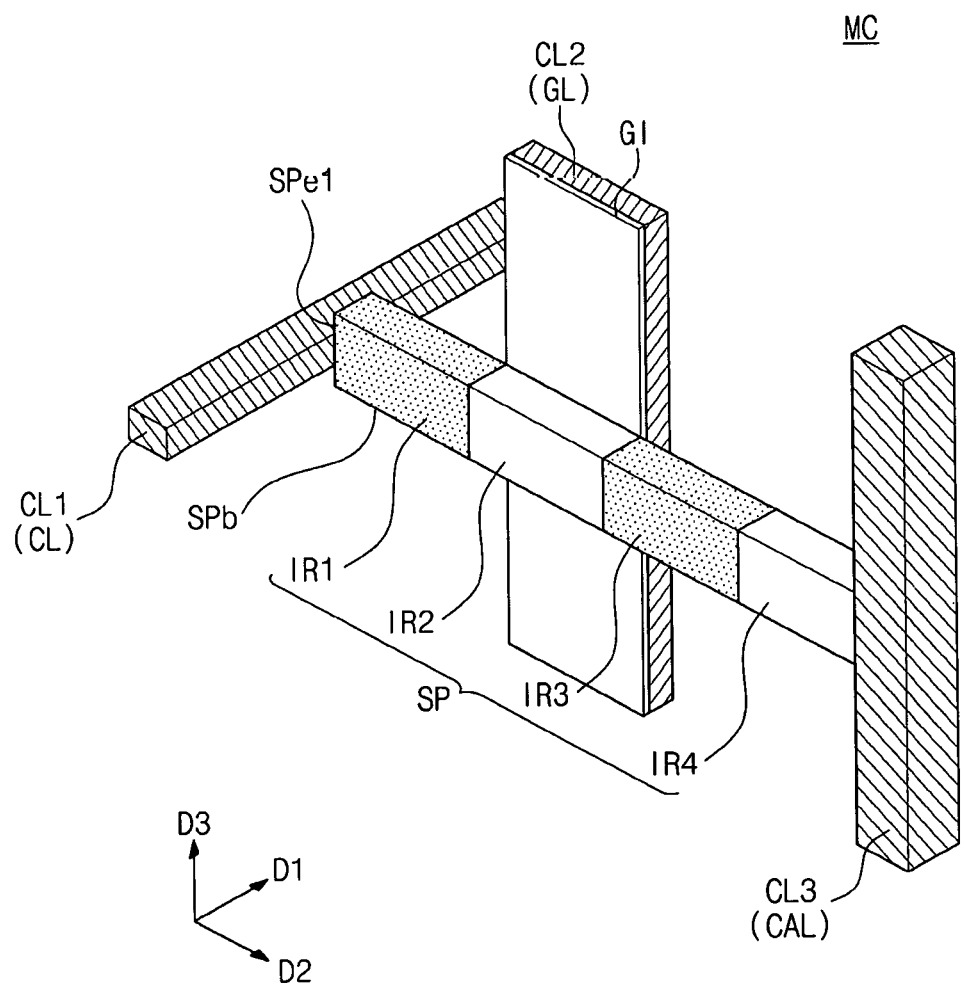
FIG. 21 is an enlarged perspective view illustrating a memory cell of a three-dimensional semiconductor memory device according to some embodiments of the inventive concepts.
Figure 22:
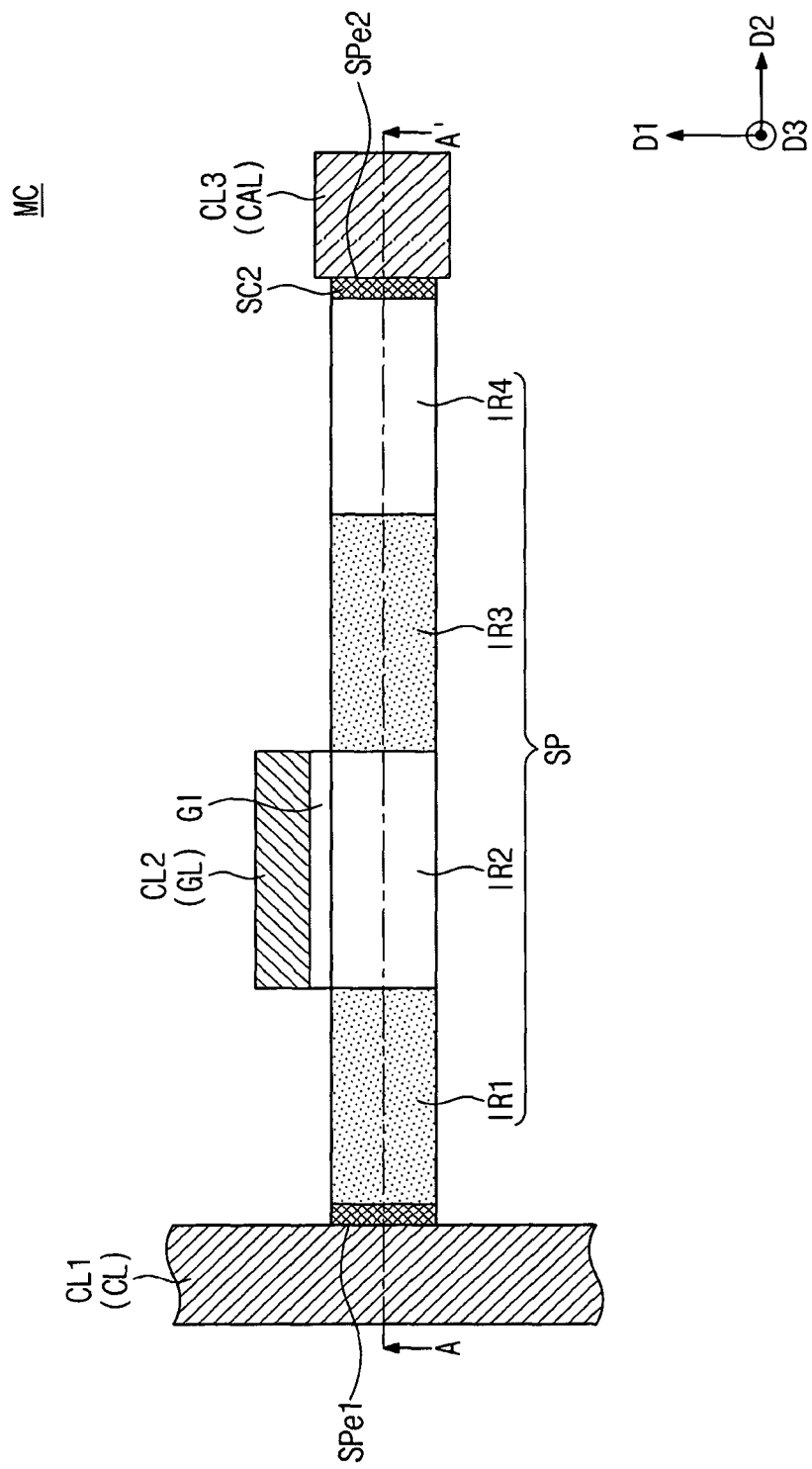
FIG. 22 is a plan view illustrating the memory cell of FIG. 21.
Figure 23:
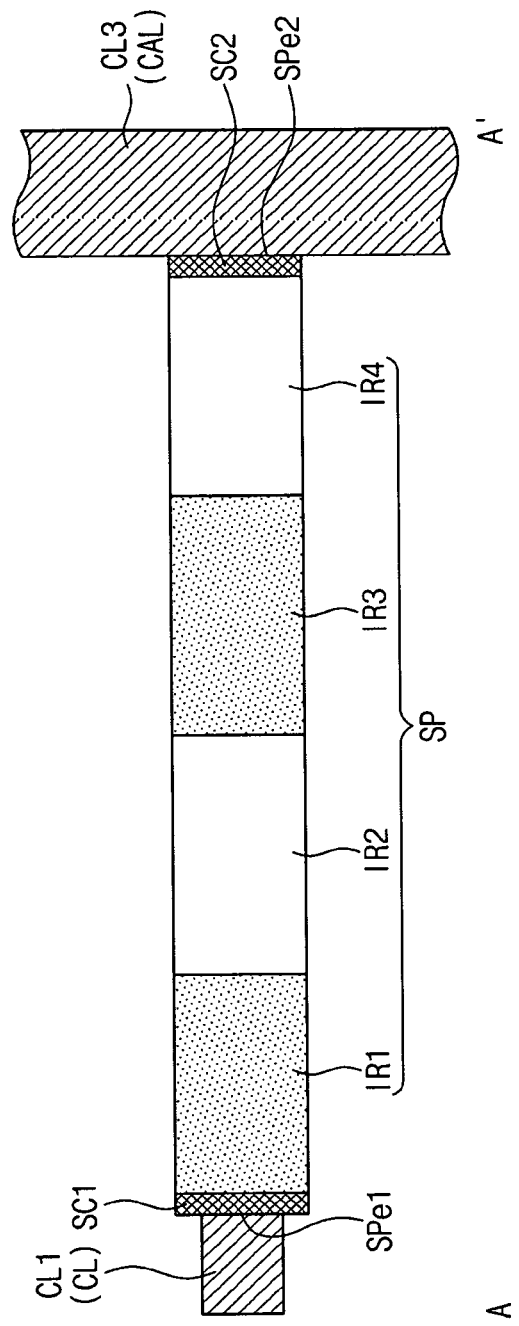
FIG. 23 is a sectional view taken along line A-A' of FIG. 22.

FIG. 21 is an enlarged perspective view illustrating a memory cell of a three-dimensional semiconductor memory device according to some embodiments of the inventive concepts. FIG. 22 is a plan view illustrating the memory cell of FIG. 21. FIG. 23 is a sectional view taken along line A-A' of FIG. 22. Referring to FIGS. 21 to 23, the first conductive line CL1 may be in direct contact with the first end SPe1 of the semiconductor pattern SP. Except for the presence of the fourth impurity region IR4, the semiconductor memory device according to embodiments described with reference to FIGS. 21-23 may be configured to have substantially the same features as those described with reference to FIGS. 6 to 8.

Figure 24:
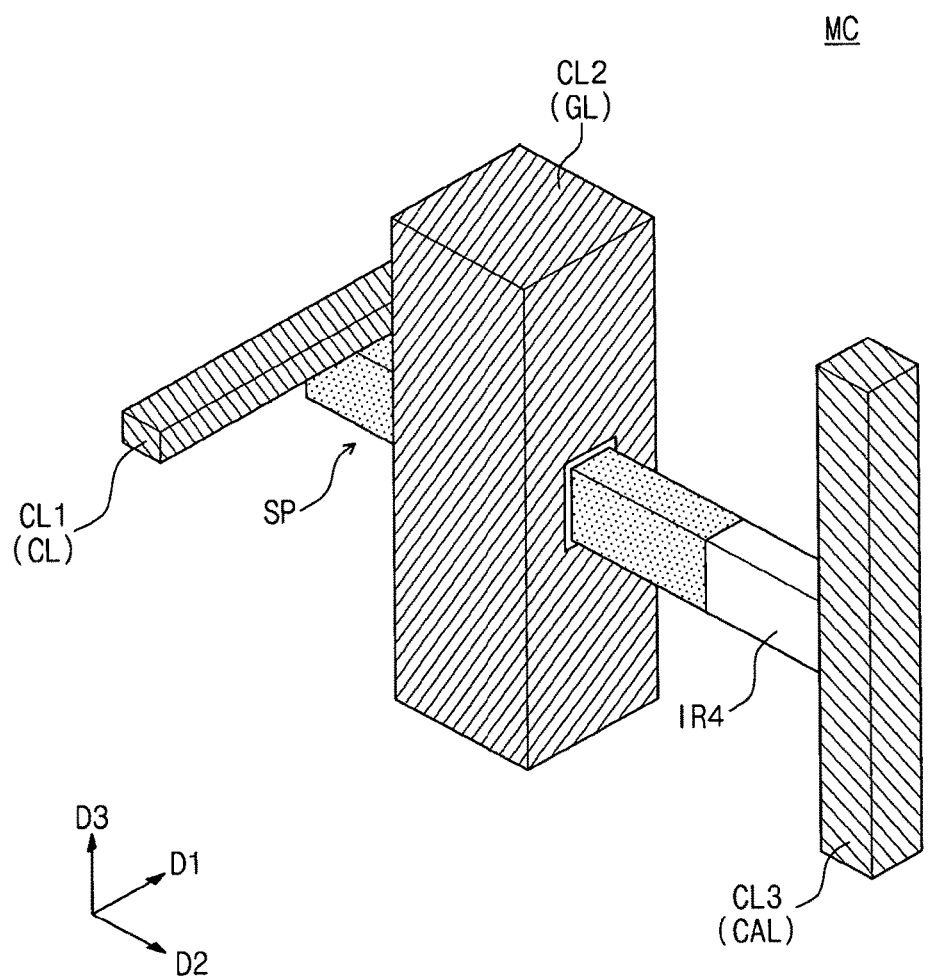
FIG. 24 is an enlarged perspective view illustrating a memory cell of a three-dimensional semiconductor memory device according to some embodiments of the inventive concepts.

FIG. 24 is an enlarged perspective view illustrating a memory cell of a three-dimensional semiconductor memory device according to some embodiments of the inventive concepts. Referring to FIG. 24, the second conductive line CL2 may be provided to surround the second impurity region IR2. Except for the presence of the fourth impurity region IR4, the semiconductor memory device according to FIG. 24 may be configured to have substantially the same features as those described with reference to FIG. 9.

Figure 25:
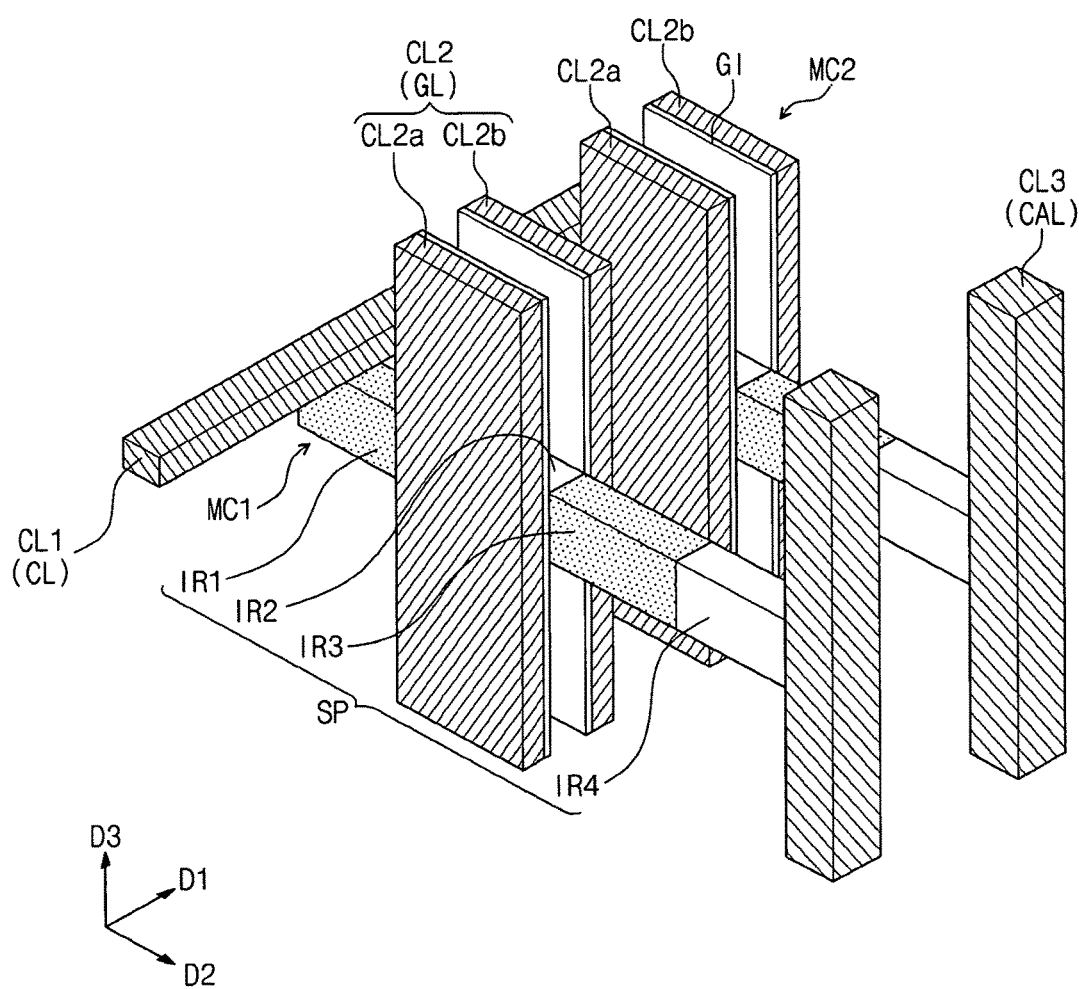
FIG. 25 is an enlarged perspective view illustrating first and second memory cells of a three-dimensional semiconductor memory device according to some embodiments of the inventive concepts.
Figure 26:
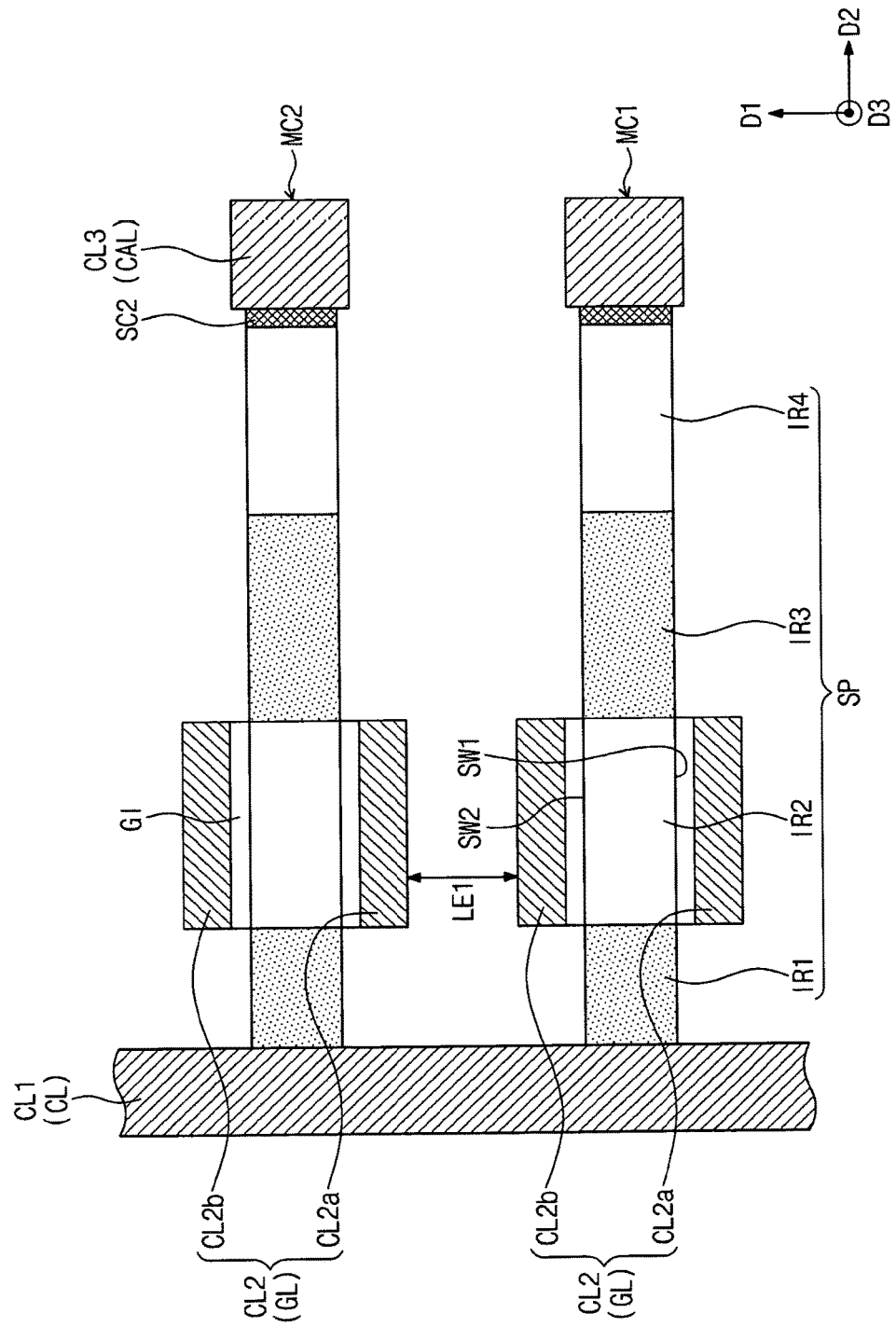
FIG. 26 is a plan view illustrating the first and second memory cells of FIG. 25.

FIG. 25 is an enlarged perspective view illustrating first and second memory cells of a three-dimensional semiconductor memory device according to some embodiments of the inventive concepts. FIG. 26 is a plan view illustrating the first and second memory cells of FIG. 25. Referring to FIGS. 25 and 26, the first memory cell MC1 and the second memory cell MC2 may be arranged (e.g., spaced apart from each other) in the first direction D1. The second conductive lines CL2 adjacent to the semiconductor patterns SP may be provided. Each of the second conductive lines CL2 may include the first sub-conductive line CL2a and the second sub-conductive line CL2b. Except for the presence of the fourth impurity region IR4, the semiconductor memory device according to embodiments described with reference to FIGS. 25 and 26 may be configured to have substantially the same features as those described with reference to FIGS. 10 and 11.

Figure 27:
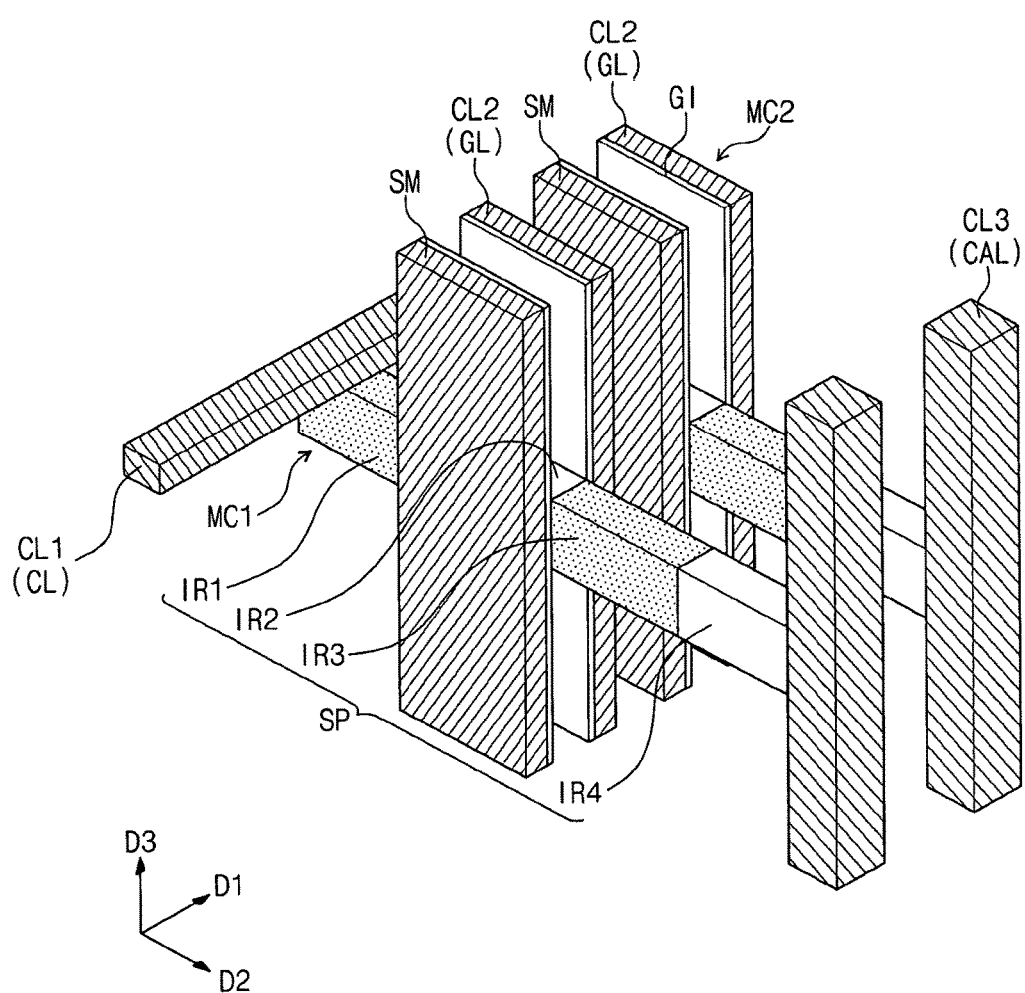
FIG. 27 is an enlarged perspective view illustrating first and second memory cells of a three-dimensional semiconductor memory device according to some embodiments of the inventive concepts.
Figure 28:
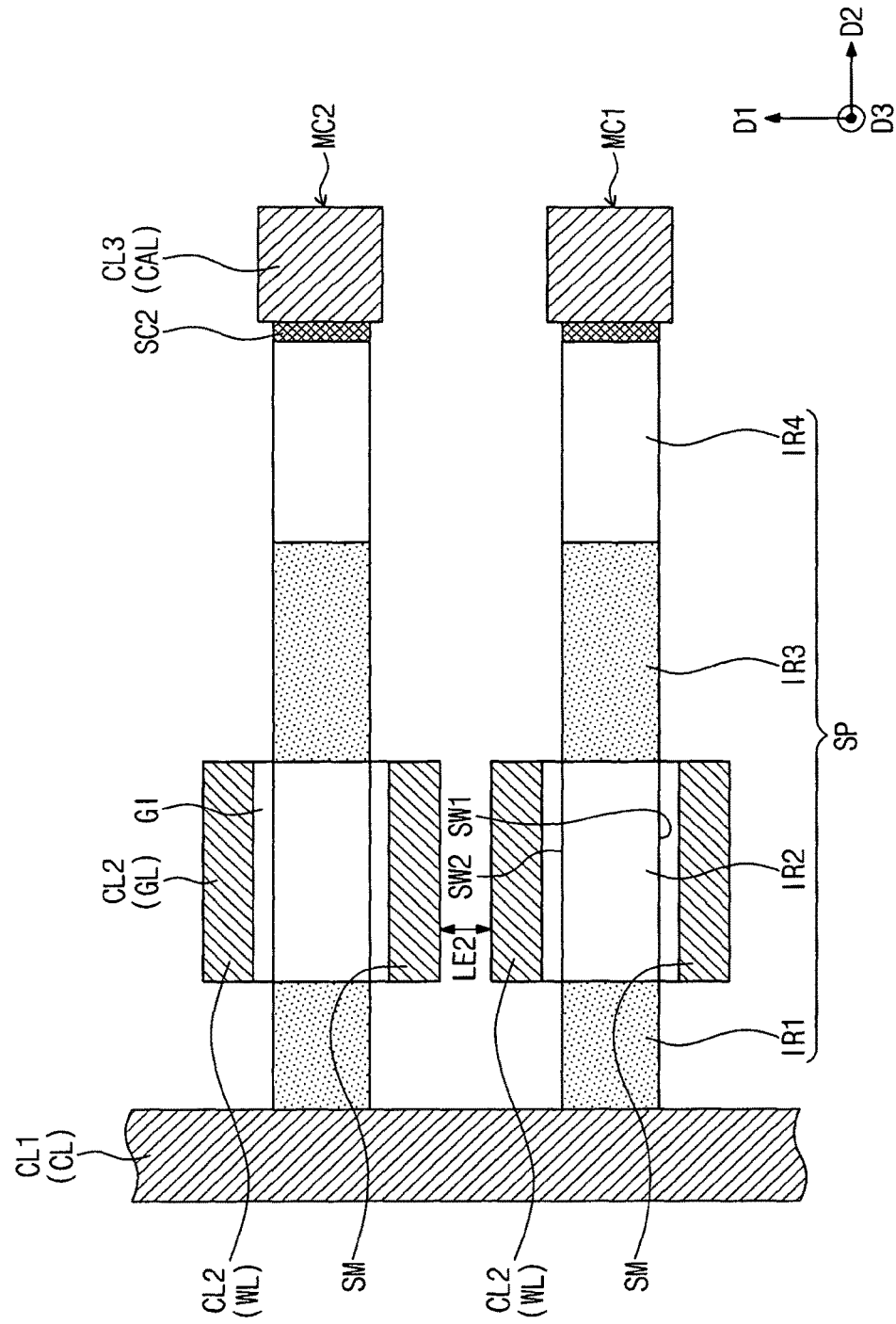
FIG. 28 is a plan view illustrating the first and second memory cells of FIG. 27.

FIG. 27 is an enlarged perspective view illustrating first and second memory cells of a three-dimensional semiconductor memory device according to some embodiments of the inventive concepts. FIG. 28 is a plan view illustrating the first and second memory cells of FIG. 27. Referring to FIGS. 27 and 28, the shield line SM may be adjacent to the first side wall SW1 of each of the semiconductor patterns SP, and the second conductive line CL2 may be adjacent to the second side wall SW2. Except for the presence of the fourth impurity region IR4, the semiconductor memory device according to embodiments described with reference to FIGS. 27 and 28 may be configured to have substantially the same features as those described with reference to FIGS. 12 and 13.

Figure 29:
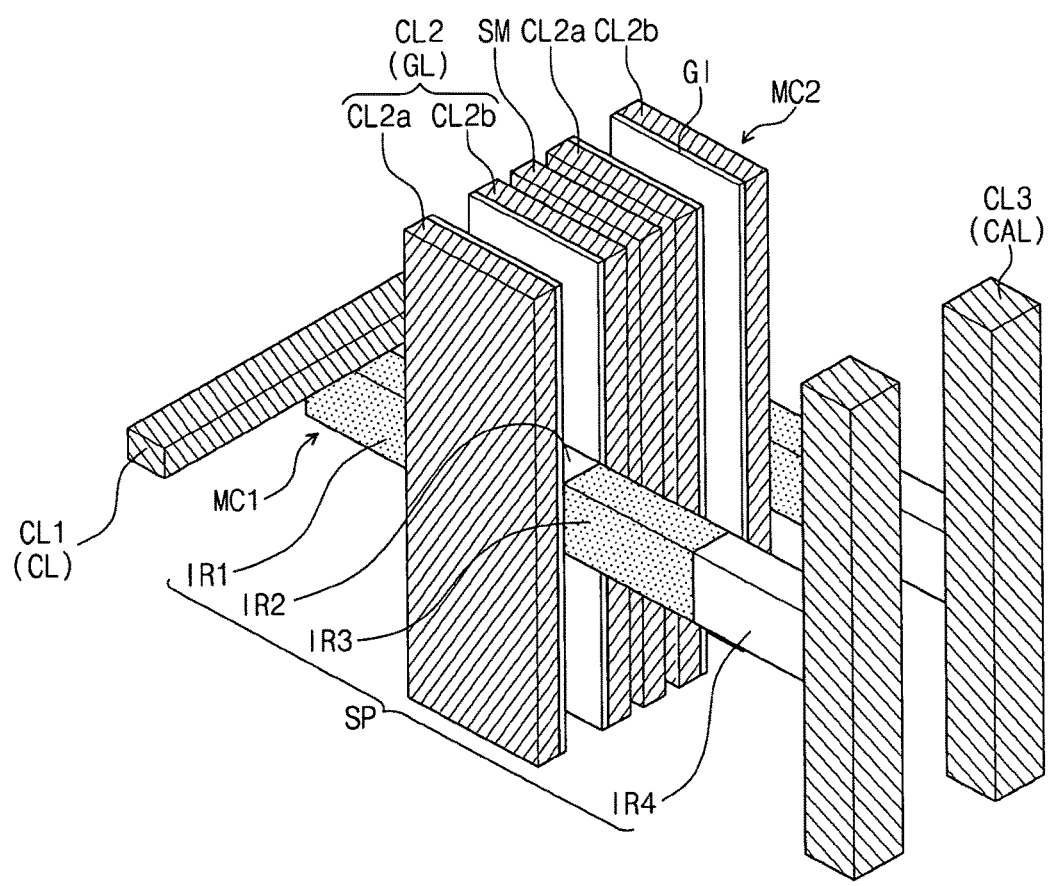
FIG. 29 is an enlarged perspective view illustrating first and second memory cells of a three-dimensional semiconductor memory device according to some embodiments of the inventive concepts.
Figure 30:
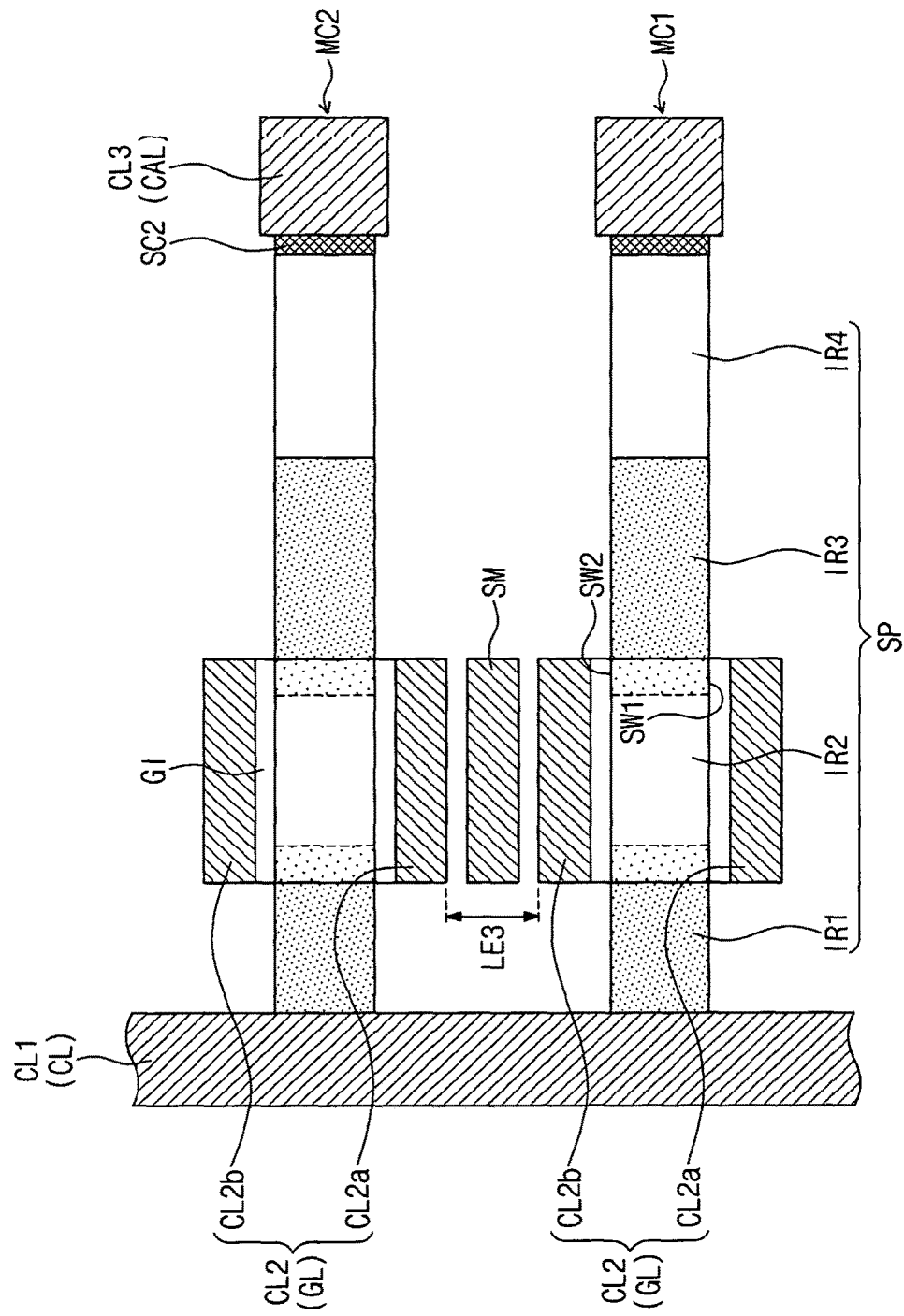
FIG. 30 is a plan view illustrating the first and second memory cells of FIG. 29.

FIG. 29 is an enlarged perspective view illustrating first and second memory cells of a three-dimensional semiconductor memory device according to some embodiments of the inventive concepts. FIG. 30 is a plan view illustrating the first and second memory cells of FIG. 29. Referring to FIGS. 29 and 30, each of the second conductive lines CL2 may include the first and second sub-conductive lines CL2a and CL2b. The shield line SM may be provided between the first and second memory cells MC1 and MC2. The shield line SM may be provided between the second sub-conductive line CL2*b* of the first memory cell MC1 and the first sub-conductive line CL2*a* of the second memory cell MC2. Except for the presence of the fourth impurity region IR4, the semiconductor memory device according to embodiments described with reference to FIGS. 29 and 30 may be configured to have substantially the same features as those described with reference to FIGS. 14 and 15.

Figure 31:
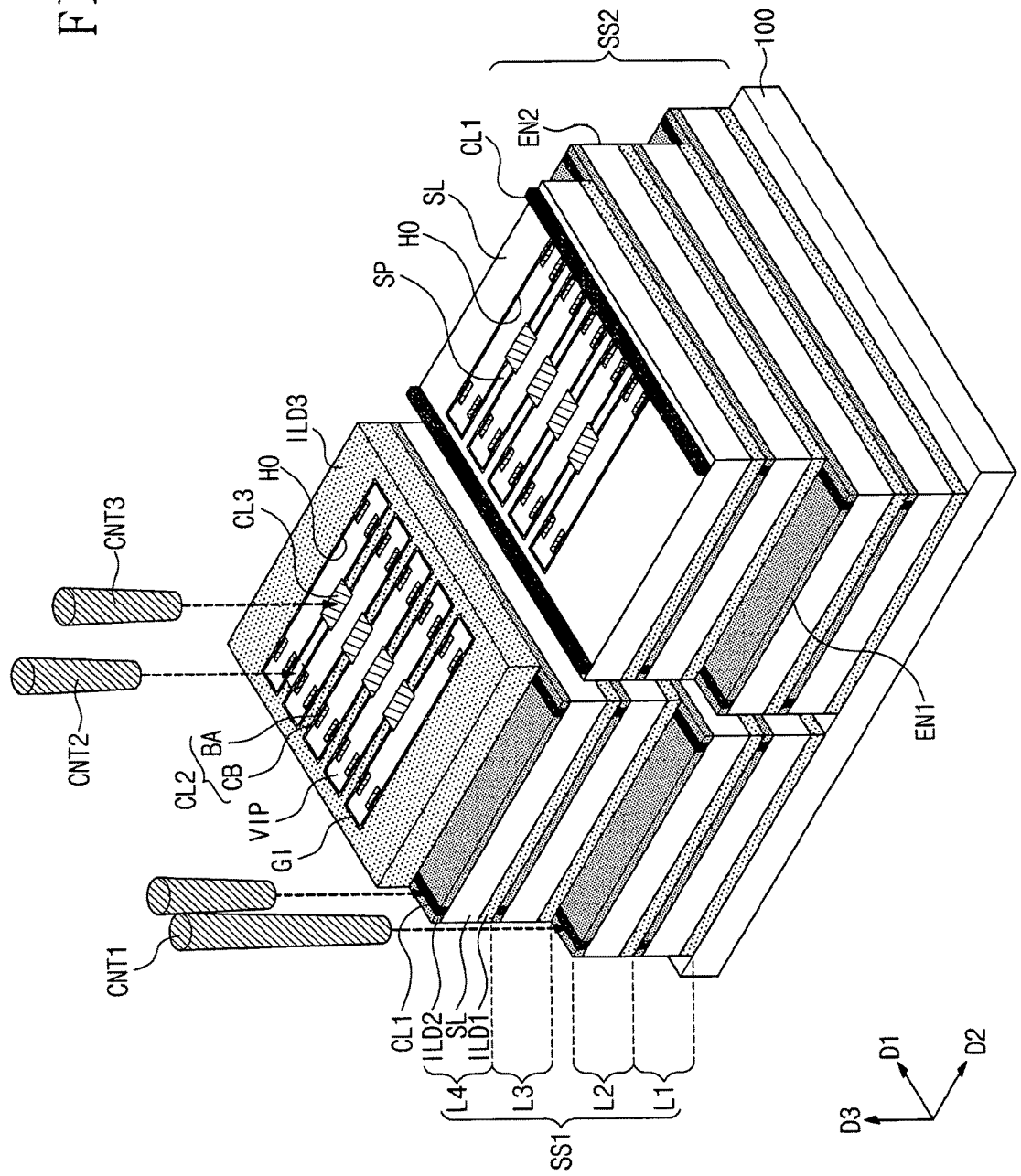
FIG. 31 is a perspective view illustrating a three-dimensional semiconductor memory device according to some embodiments of the inventive concepts.
Figure 32:
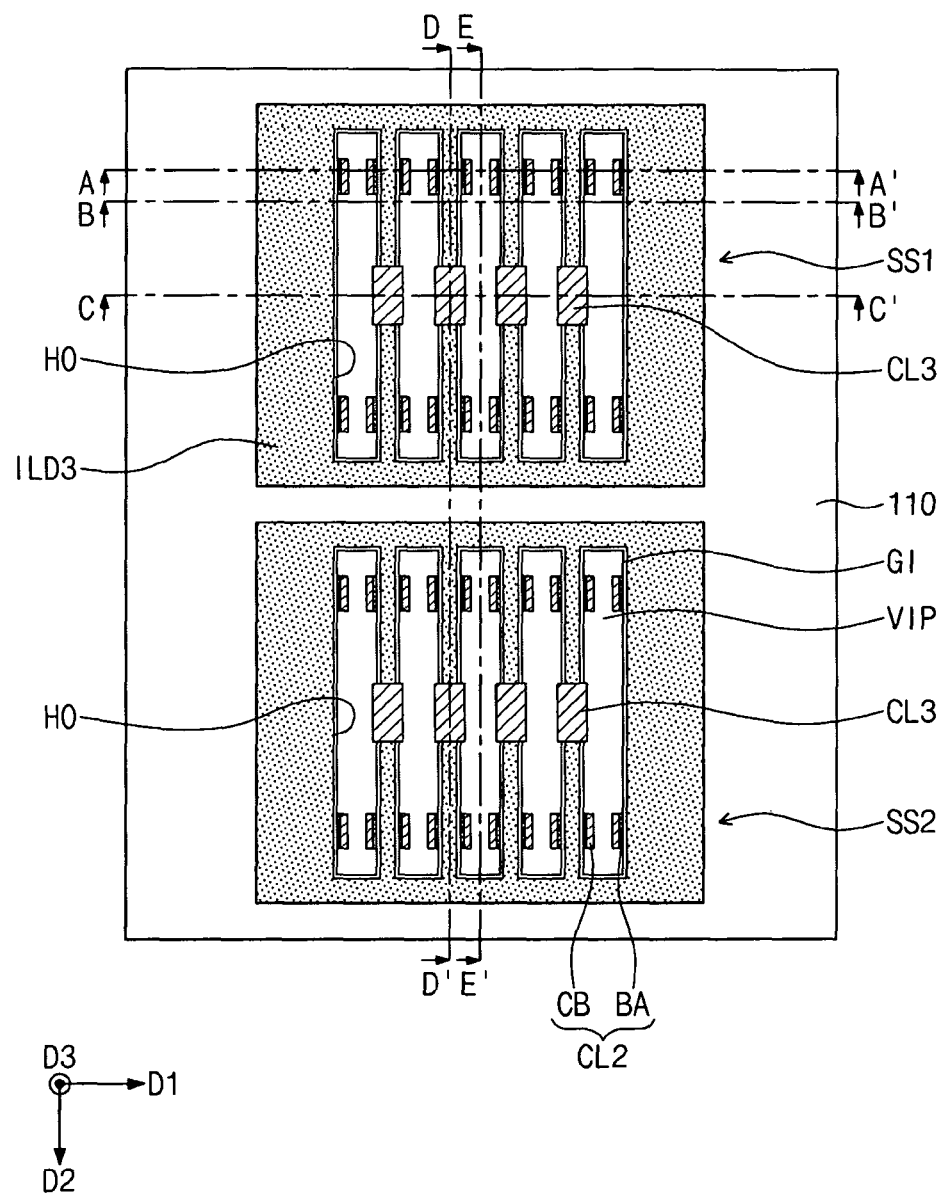
FIG. 32 is a plan view illustrating the memory device of FIG. 31.
Figure 33A:
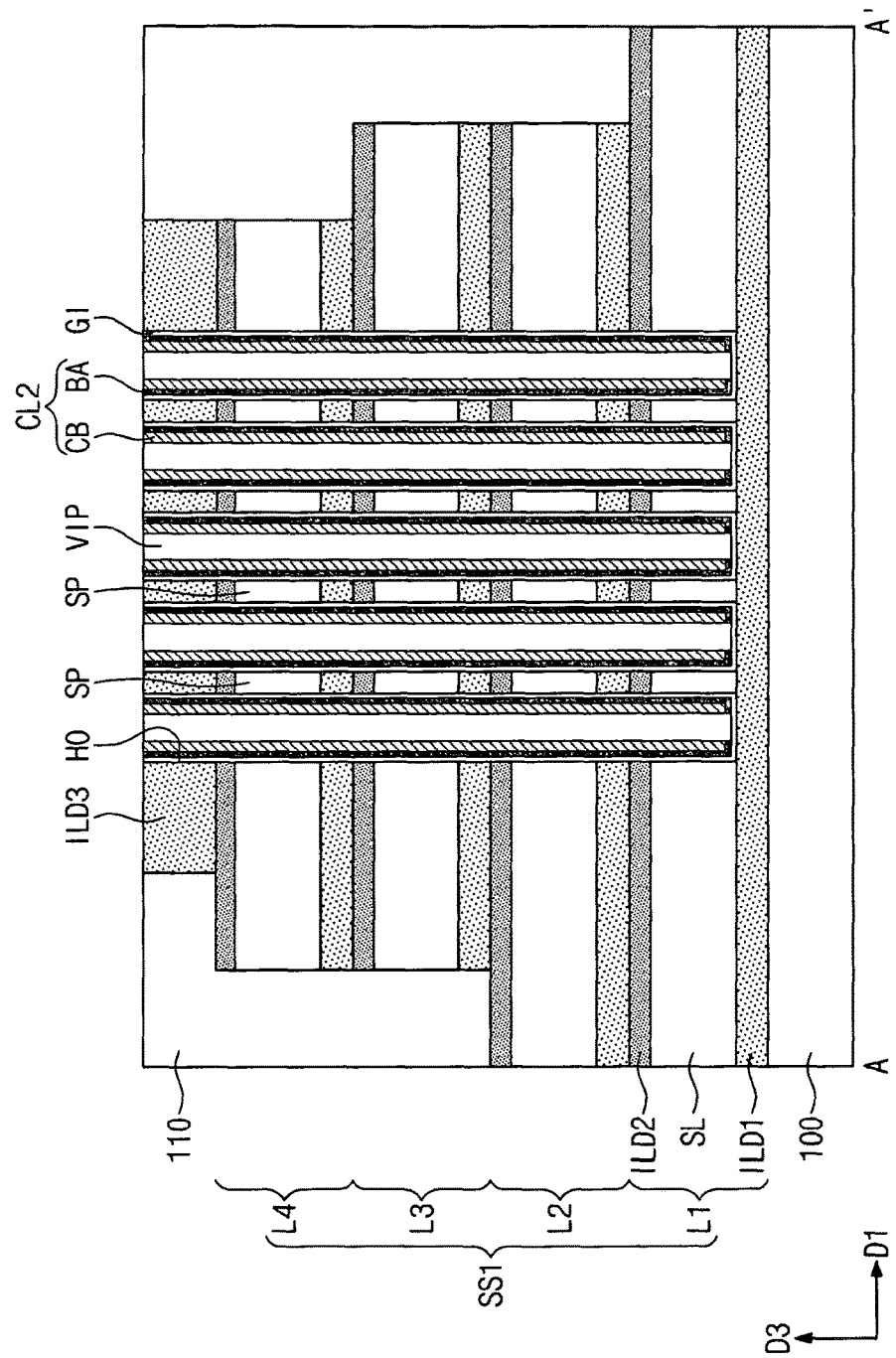
FIGS. 33A to 33E are sectional views taken along lines A-A', B-B', C-C', D-D' and E-E', respectively, of FIG. 32.
Figure 33B:
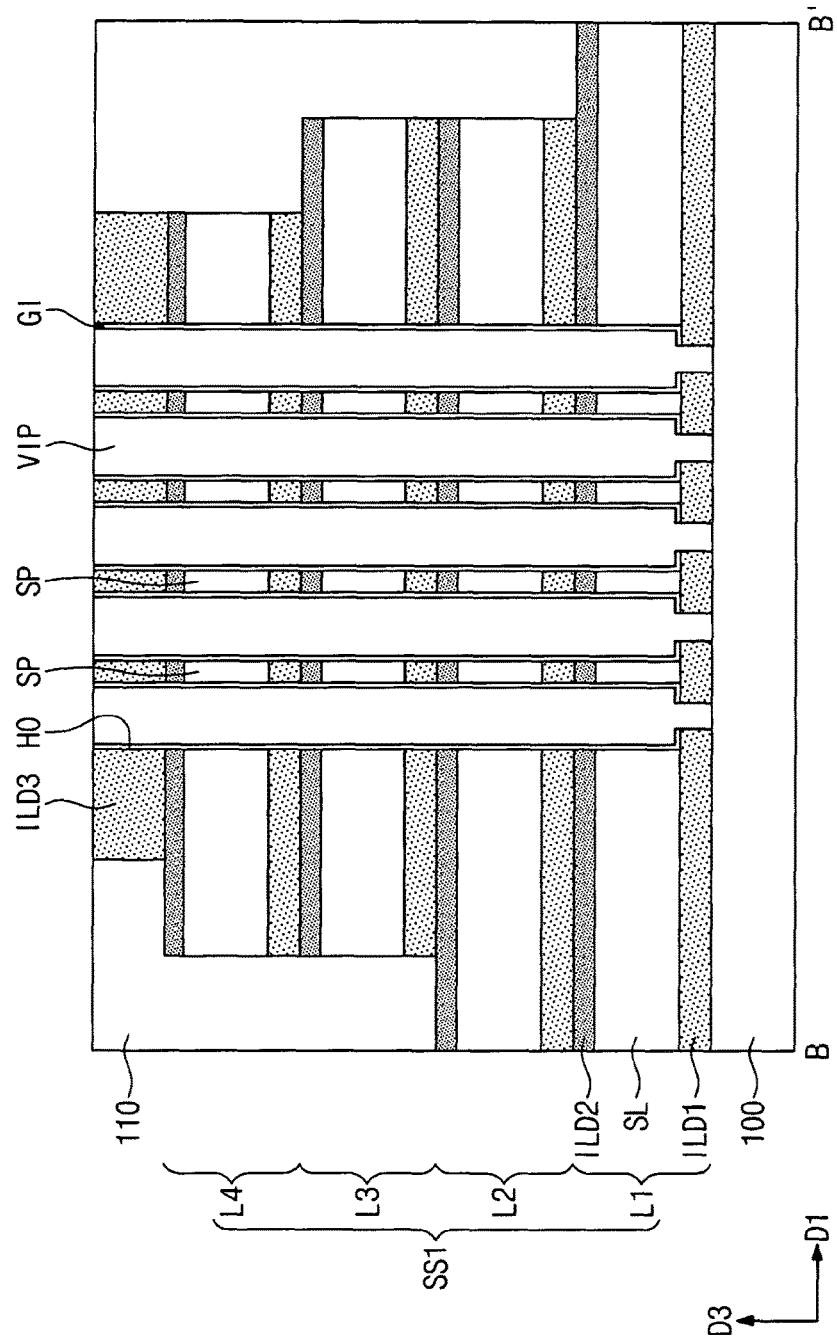
Figure 33C:
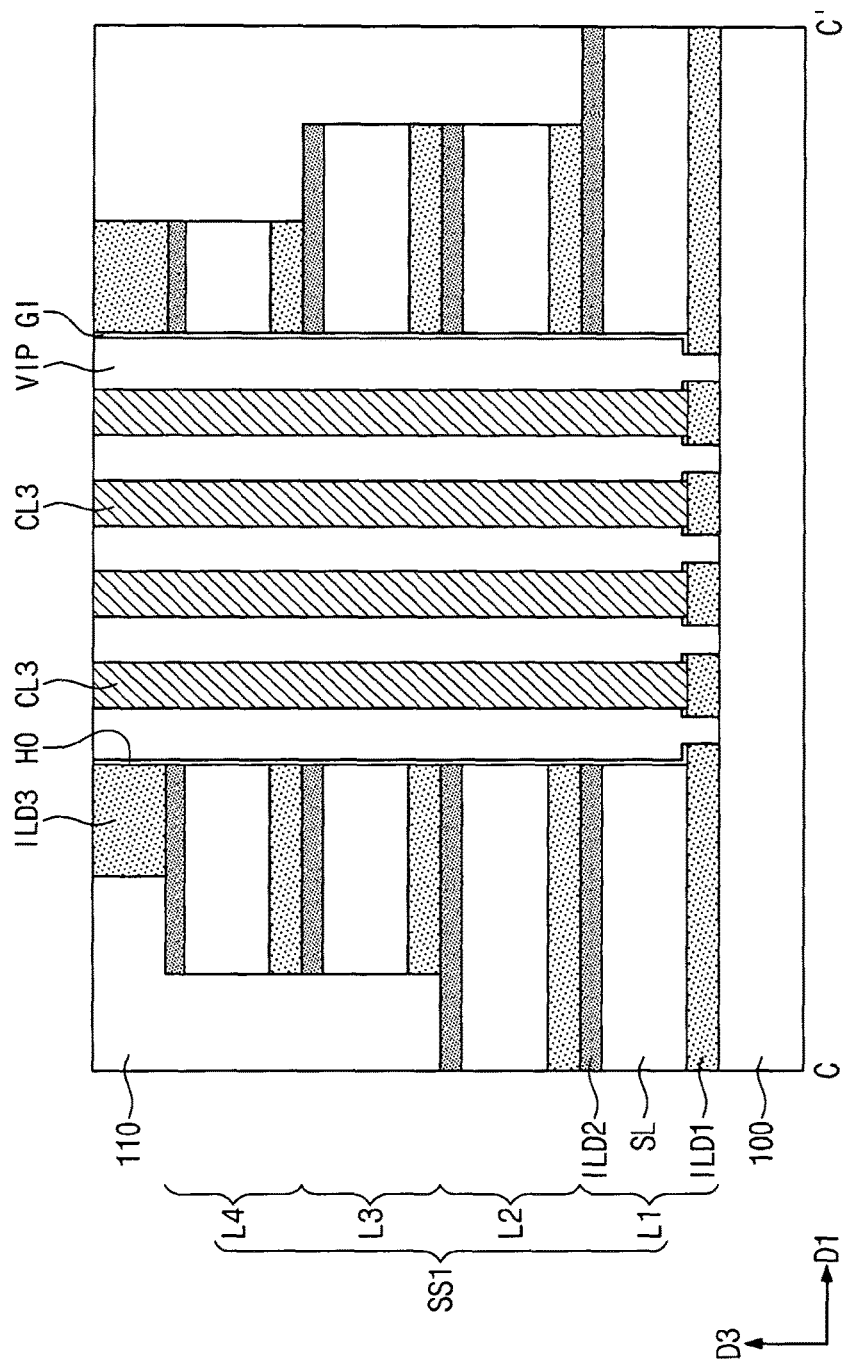
Figure 33D:
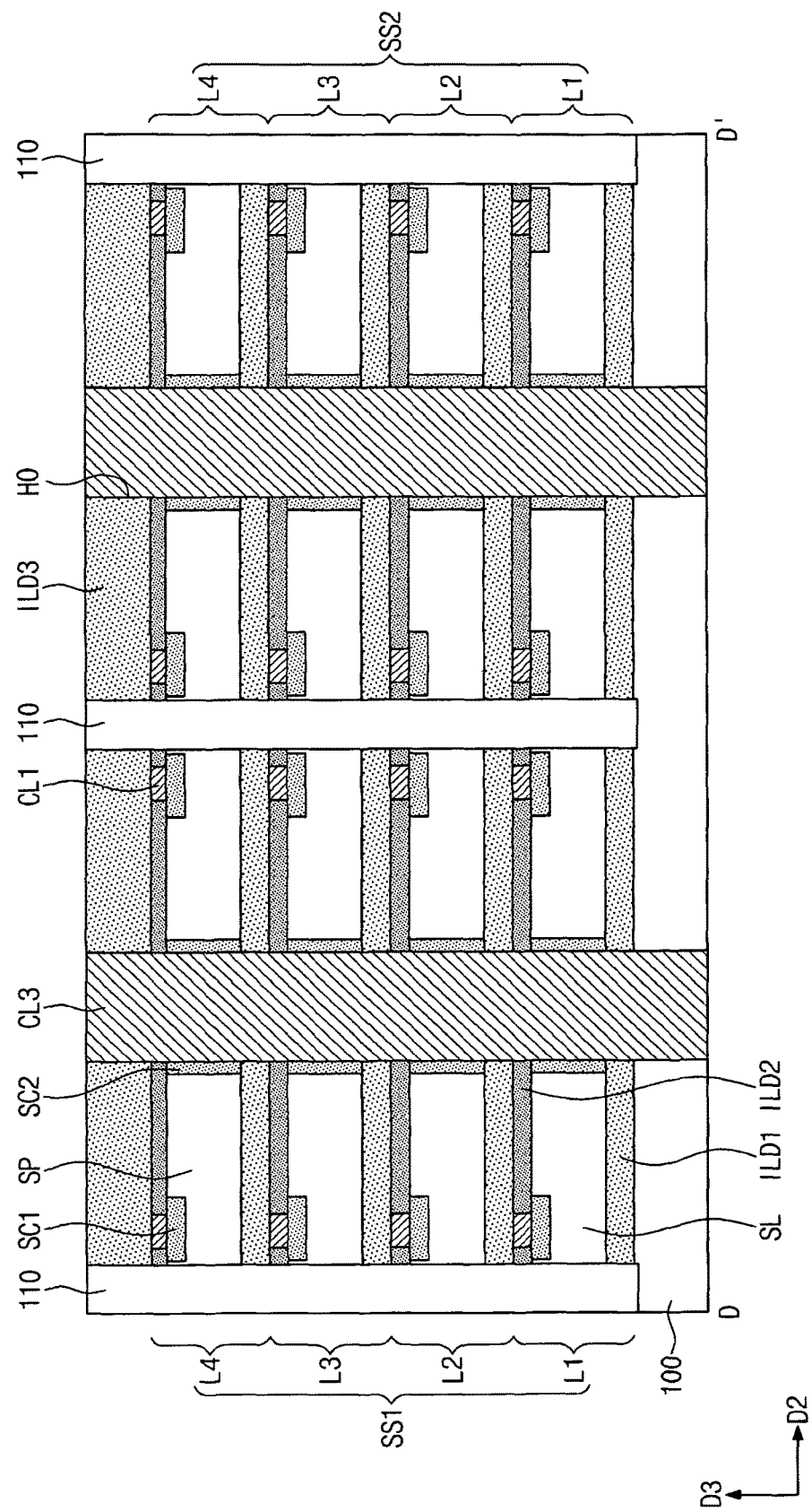
Figure 33E:
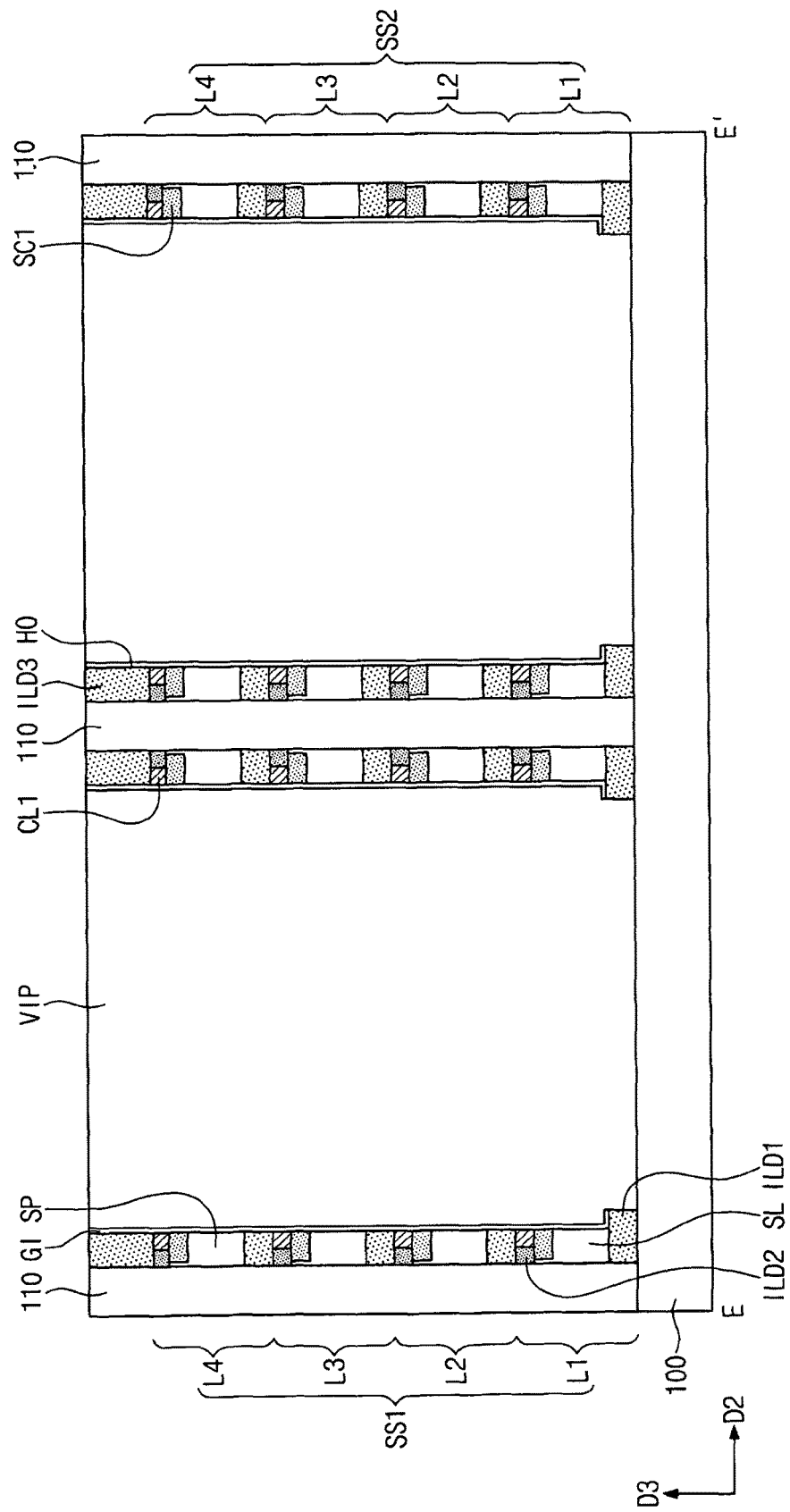

FIG. 31 is a perspective view illustrating a three-dimensional semiconductor memory device according to some embodiments of the inventive concepts. FIG. 32 is a plan view illustrating the memory device of FIG. 31. FIGS. 33A to 33E are sectional views taken along lines A-A', B-B', C-C', D-D' and E-E', respectively, of FIG. 32. In the following description, an element previously described with reference to FIGS. 1 to 5 and FIGS. 16 to 20 may be identified by the same reference number without repeating an overlapping description thereof.

Referring to FIGS. 31, 32, and 33A to 33E, a plurality of stacks SS1 and SS2 may be provided on the substrate 100. The stacks SS1 and SS2 may include a first stack SS1 and a second stack SS2. Each of the first and second stacks SS1 and SS2 may extend in the first direction D1. The first and second stacks SS1 and SS2 may be spaced apart from each other in the second direction D2.

Each of the first and second stacks SS1 and SS2 may include first to fourth layers L1, L2, L3, and L4, which are sequentially stacked on the substrate 100. Each of the first to fourth layers L1, L2, L3, and L4 may include a first insulating layer ILD1, a semiconductor layer SL (which may include one or more semiconductor patterns SP), and a second insulating layer ILD2. The first insulating layer ILD1, the semiconductor layer SL, and the second insulating layer ILD2 may be sequentially stacked. The first insulating layer ILD1 and the second insulating layer ILD2 may be used to vertically separate the semiconductor layer SL therebetween from another semiconductor layer SL.

Each of the first to fourth layers L1, L2, L3, and L4 may further include at least one first conductive line CL1 extending in the first direction D1. For example, each of the first to fourth layers L1, L2, L3, and L4 may include a pair of the first conductive lines CL1 spaced apart from each other in the second direction D2. The first conductive lines CL1 may be provided at the same level as the second insulating layer ILD2. The second insulating layer ILD2 may be provided on (e.g., to cover) side walls of the first conductive lines CL1. The first conductive lines CL1 may be provided on a top surface of the semiconductor layer SL. As an example, the first conductive lines CL1 may be used as the bit lines BL described with reference to FIG. 1 or as the cathode lines CL described with reference to FIG. 16.

The semiconductor layer SL may be formed of or include a semiconductor material (e.g., silicon, germanium, silicon-germanium, or indium gallium zinc oxide (IGZO)). The first insulating layer ILD1 and the second insulating layer ILD2 may be formed of or include insulating materials different from each other. Each of the first insulating layer ILD1 and the second insulating layer ILD2 may be formed of at least one material selected from the group consisting of silicon oxide, silicon nitride, silicon oxynitride, carbon-containing silicon oxide, carbon-containing silicon nitride, and carbon-containing silicon oxynitride. For example, the first insulating layer ILD1 may be a carbon-containing silicon oxide layer (e.g., SiOC), and the second insulating layer ILD2 may be a silicon nitride layer (e.g., SiN).

In each of the first and second stacks SS1 and SS2, each of the first to fourth layers L1, L2, L3, and L4 may include a first end EN1 and a second end EN2, which are opposite to each other in the first direction D1. Each of the first end EN1 and the second end EN2 may extend in the second direction D2.

The second end EN2 of each of the second and third layers L2 and L3 may protrude in the first direction D1, compared with the second end EN2 of the fourth layer L4. The second end EN2 of the second layer L2 may be vertically aligned to the second end EN2 of the third layer L3. The second end EN2 of the first layer L1 may protrude in the first direction D1, compared with the second end EN2 of each of the second and third layers L2 and L3.

The first end EN1 of each of the first and second layers L1 and L2 may protrude in an opposite direction of the first direction D1, compared with the first end EN1 of each of the third and fourth layers L3 and L4. The first end EN1 of the first layer L1 may be vertically aligned to the first end EN1 of the second layer L2. The first end EN1 of the third layer L3 may be vertically aligned to the first end EN1 of the fourth layer L4.

A plurality of holes HO may be formed to penetrate each of the first and second stacks SS1 and SS2. Each of the semiconductor layers SL may include the semiconductor patterns SP defined by the holes HO.

In detail, each of the semiconductor layers SL may include an extended portion, which is provided below the first conductive line CL1 and is extended in the first direction D1, and the semiconductor patterns SP, which are extended from the extended portion in the second direction D2. The semiconductor pattern SP may be provided between a pair of adjacent ones of the holes HO.

As an example, each of the semiconductor patterns SP may be substantially the same as the semiconductor pattern SP of the memory device (e.g., the 1T DRAM) previously described with reference to FIGS. 1 to 5. For example, each of the semiconductor patterns SP may be provided to include the first to third impurity regions.

As another example, each of the semiconductor patterns SP may be substantially the same as the semiconductor pattern SP of the memory device (e.g., the thyristor DRAM) previously described with reference to FIGS. 16 to 20. For example, each of the semiconductor patterns SP may be provided to include the first to fourth impurity regions.

The first conductive line CL1 may be provided on the first silicide layer SC1 of the semiconductor pattern SP. The first conductive line CL1 may be electrically connected to the semiconductor pattern SP through the first silicide layer SC1.

The second conductive lines CL2 may be provided in each of the holes HO penetrating the stack SS1 or SS2 and may be extended in the vertical or third direction D3. For example, the second conductive lines CL2 may be provided to penetrate the first and second stacks SS1 and SS2. A pair of the second conductive lines CL2 may be provided on opposite side surfaces of each of the semiconductor patterns SP. As an example, the pair of the second conductive lines CL2 may be used as the word line WL described with reference to FIG. 1 or as the gate line GL described with reference to FIG. 16.

Each of the second conductive lines CL2 may include a barrier pattern BA and a conductor CB. The conductor CB may be a line-shape pattern extending in the third direction D3. The barrier pattern BA may be provided on a side surface and a bottom surface of the conductor CB. The conductor CB may be formed of or include a metallic material (e.g., tungsten, titanium, tantalum, and so forth), and the barrier pattern BA may be formed of or include a conductive metal nitride material (e.g., titanium nitride, tantalum nitride, and so forth). The barrier pattern BA may be configured to inhibit/prevent a metallic element in the conductor CB from being diffused into the semiconductor pattern SP.

The gate insulating layer GI may be provided on inner side surfaces of the stack SS1 or SS2 exposed by each of the holes HO. Thus, the gate insulating layer GI may be provided between each of the semiconductor patterns SP and each of the second conductive lines CL2. The barrier pattern BA of each of the second conductive lines CL2 may be in direct contact with the gate insulating layer GI.

Vertical insulating patterns VIP may be provided in the holes HO, respectively, on/adjacent (e.g., to cover) the second conductive lines CL2. The vertical insulating pattern VIP may be provided between a pair of the second conductive lines CL2 which are placed adjacent to each other. The vertical insulating pattern VIP may be provided between a pair of the semiconductor patterns SP which are placed adjacent to each other. The vertical insulating pattern VIP may be a pillar-shaped pattern extending in the third direction D3. The vertical insulating patterns VIP may be formed of or include at least one of, for example, silicon oxide, silicon nitride, or silicon oxynitride.

The third conductive lines CL3 may be provided to penetrate the first and second stacks SS1 and SS2. Each of the third conductive lines CL3 may be placed between a pair of the semiconductor patterns SP, which are adjacent to each other in the second direction D2, and may be extended in the vertical or third direction D3.

The pair of the semiconductor patterns SP, which are adjacent to each other in the second direction D2, may be connected in common to the third conductive line CL3. The third conductive line CL3 may be electrically connected to the semiconductor pattern SP through the second silicide layer SC2. As an example, the third conductive lines CL3 may be used as the common drain lines CDL described with reference to FIG. 1 or as the common anode lines CAL described with reference to FIG. 16.

An interlayer insulating layer 110 may be provided on (e.g., to cover) the first and second stacks SS1 and SS2. For example, the interlayer insulating layer 110 may be formed of or include at least one of silicon oxide, silicon nitride, or silicon oxynitride. A third insulating layer ILD3 may be provided on each of the first and second stacks SS1 and SS2. The interlayer insulating layer 110, the third insulating layers ILD3, the vertical insulating patterns VIP, the second conductive lines CL2, and the third conductive lines CL3 may be provided to have respective top surfaces that are substantially coplanar with each other.

At least one first contact CNT1 may be provided to penetrate the interlayer insulating layer 110 and may be connected to at least one of the first conductive lines CL1. At least one second contact CNT2 may be connected to at least one of the second conductive lines CL2. At least one third contact CNT3 may be connected to at least one of the third conductive lines CL3. The first contact CNT1 may be provided on an exposed portion of the first conductive line CL1, which is located at an end portion of the stack SS1 or SS2. The second contact CNT2 may be provided on an exposed portion of the second conductive line CL2, which is located at a top surface of the stack SS1 or SS2. The third contact CNT3 may be provided on an exposed portion of the third conductive line CL3, which is located at the top surface of the stack SS1 or SS2.

According to some embodiments of the inventive concepts, a three-dimensional semiconductor memory device may include capacitor-free memory cells which are three-dimensionally arranged on a substrate. Since there is no capacitor, it may be possible to reduce a size of each of the memory cells. Since the memory cells are three-dimensionally arranged, it may be possible to increase an integration density of a memory device.

Although example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device comprising:
a substrate;
a stack comprising a plurality of layers that are vertically stacked on the substrate, each of the plurality of layers comprising semiconductor patterns that extend in a first direction and a first conductive line that is connected to at least one of the semiconductor patterns and extends in a second direction crossing the first direction;
a second conductive line and a third conductive line that extend in a third direction, perpendicular to the first and second directions, to penetrate the stack, wherein the semiconductor patterns comprise a first semiconductor pattern and a second semiconductor pattern that are adjacent and spaced apart from each other in the first direction in a first layer among the plurality of layers, and a third semiconductor pattern, in a second layer among the plurality of layers, that is vertically overlapped by the first semiconductor pattern in the third direction; and
a gate insulating layer,
wherein the gate insulating layer is between the second conductive line and the first and third semiconductor patterns, and
wherein the third conductive line is between, and connected in common to, the first and second semiconductor patterns.

2. The semiconductor memory device of claim 1,
wherein each of the semiconductor patterns comprises a first impurity region, a second impurity region, and a third impurity region,
wherein the first and third impurity regions comprise a first conductivity type,
wherein the second impurity region comprises a second conductivity type different from the first conductivity type,
wherein the first conductive line is connected to the first impurity region, and
wherein the second conductive line is adjacent the second impurity region.

3. The semiconductor memory device of claim 2,
wherein each of the semiconductor patterns further comprises a fourth impurity region,
wherein the fourth impurity region comprises the second conductivity type, and
wherein the third conductive line is connected to the fourth impurity region.

4. The semiconductor memory device of claim 1,
wherein the first conductive line is on a top surface of the first semiconductor pattern, and
wherein a memory cell comprising the first semiconductor pattern comprises a capacitor-free memory cell.

5. The semiconductor memory device of claim 1,
wherein the second conductive line comprises a first sub-conductive line and a second sub-conductive line that extend in the third direction, wherein each of the first and third semiconductor patterns comprises a first side wall and a second side wall opposite to the first side wall, wherein the first sub-conductive line is adjacent the first side wall, and wherein the second sub-conductive line is adjacent the second side wall.

6. The semiconductor memory device of claim 1, wherein the semiconductor patterns further comprise a fourth semiconductor pattern that is adjacent and spaced apart from the first semiconductor pattern in the second direction in the first layer, and wherein the semiconductor memory device further comprises a shield line that extends in the third direction to penetrate the stack between the first and fourth semiconductor patterns.

7. The semiconductor memory device of claim 1, wherein the first and third semiconductor patterns penetrate the second conductive line.

8. A semiconductor memory device comprising:
a substrate;
a stack comprising a plurality of layers that are vertically stacked on the substrate, each of the plurality of layers comprising first and second semiconductor structures that are adjacent and spaced apart from each other in a first direction, and a first conductive line that extends in the first direction to connect to the first and second semiconductor structures;
second conductive lines that extend vertically in a second direction that is perpendicular to the first direction to penetrate the stack and are spaced apart from each other in the first direction, first and second ones of the second conductive lines being adjacent the first and second semiconductor structures, respectively;
a first gate insulating layer between the first semiconductor structure and the first one of the second conductive lines;
a second gate insulating layer between the second semiconductor structure and the second one of the second conductive lines;
third conductive lines that extend vertically in the second direction and are spaced apart from each other in the first direction, first and second ones of the third conductive lines being connected to respective first ends of the first and second semiconductor structures; and
a shield line that extends vertically in the second direction to penetrate the stack between the first and second ones of the second conductive lines.

9. The semiconductor memory device of claim 8,
wherein each of the first and second semiconductor structures comprises a first impurity region, a second impurity region, and a third impurity region,
wherein the first and third impurity regions comprise a first conductivity type,
the second impurity region comprises a second conductivity type different from the first conductivity type,
wherein the first conductive line is connected to the first impurity region, and
wherein the second conductive line is adjacent the second impurity region.

10. The semiconductor memory device of claim 9,
wherein each of the first and second semiconductor structures further comprises lightly-doped regions between the first and second impurity regions and between the second and third impurity regions,
wherein the lightly-doped regions comprise the first conductivity type, and wherein an impurity concentration of the lightly-doped regions is lower than an impurity concentration of the first and third impurity regions.

11. The semiconductor memory device of claim 9,
wherein each of the first and second semiconductor structures further comprises a fourth impurity region adjacent the first end,
wherein the fourth impurity region comprises the second conductivity type, and
wherein the third conductive lines are connected to the fourth impurity region.

12. The semiconductor memory device of claim 8,
wherein each of the first and second semiconductor structures comprises a second end that is opposite to the first end, and
wherein the first conductive line is on respective top surfaces of the first and second semiconductor structures and adjacent the second end.

13. The semiconductor memory device of claim 8,
wherein each of the second conductive lines comprises a first sub-conductive line and a second sub-conductive line that extend vertically in the second direction,
wherein each of the first and second semiconductor structures comprises a first side wall and a second side wall opposite to the first side wall,
wherein the first sub-conductive line is adjacent the first side wall, and
wherein the second sub-conductive line is adjacent the second side wall.

14. The semiconductor memory device of claim 8, wherein the first and second semiconductor structures penetrate the first and second ones of the second conductive lines, respectively.

15. The semiconductor memory device of claim 8, further comprising:
a first silicide layer between the first conductive line and each of the first and second semiconductor structures; and
a second silicide layer between the first and second ones of the third conductive lines and the first and second semiconductor structures, respectively.

16. A semiconductor memory device comprising:
a substrate;
a stack comprising a plurality of layers that are vertically stacked on the substrate, each of the plurality of layers comprising a first insulating layer, a semiconductor layer, and a second insulating layer that are sequentially stacked;
a first conductive line that is in the second insulating layer and extends in a first direction;
a second conductive line and a third conductive line that extend vertically to penetrate the stack; and
a gate insulating layer adjacent the second conductive line,
wherein the semiconductor layer comprises a semiconductor pattern that is overlapped by the first conductive line and extends in a second direction crossing the first direction,
wherein the gate insulating layer is between the second conductive line and the semiconductor pattern, and
wherein the third conductive line is connected to a first end of the semiconductor pattern.

17. The semiconductor memory device of claim 16,
wherein the semiconductor pattern comprises a first impurity region, a second impurity region, and a third impurity region, wherein the first and third impurity regions comprise a first conductivity type, wherein the second impurity region comprises a second conductivity type different from the first conductivity type, wherein the first conductive line is connected to the first impurity region, and wherein the second conductive line is adjacent the second impurity region.

18. The semiconductor memory device of claim 17, wherein the semiconductor pattern further comprises a fourth impurity region, wherein the fourth impurity region comprises the second conductivity type, and wherein the third conductive line is connected to the fourth impurity region.

19. The semiconductor memory device of claim 16, wherein the semiconductor pattern comprises a second end that is opposite to the first end, and wherein the first conductive line is on a top surface of the semiconductor pattern and adjacent the second end.

20. The semiconductor memory device of claim 16, wherein the second conductive line comprises a first sub-conductive line and a second sub-conductive line that extend vertically, wherein the semiconductor pattern comprises a first side wall and a second side wall opposite to the first side wall, wherein the first sub-conductive line is adjacent the first side wall, and wherein the second sub-conductive line is adjacent the second side wall.

* * * * *